US008741696B2

(12) United States Patent
Scheuerlein et al.

(10) Patent No.: US 8,741,696 B2
(45) Date of Patent: Jun. 3, 2014

(54) METHODS OF FORMING PILLARS FOR MEMORY CELLS USING SEQUENTIAL SIDEWALL PATTERNING

(75) Inventors: Roy E. Scheuerlein, Cupertino, CA (US); Christopher J. Petti, Mountain View, CA (US); Yoichiro Tanaka, Nagoyashi Aichi (JP)

(73) Assignee: SanDisk 3D LLC, Milpitas, CA (US)

( * ) Notice: Subject to any disclaimer, the term of this patent is extended or adjusted under 35 U.S.C. 154(b) by 619 days.

(21) Appl. No.: 12/911,944

(22) Filed: Oct. 26, 2010

(65) Prior Publication Data

US 2011/0095338 A1   Apr. 28, 2011

Related U.S. Application Data

(60) Provisional application No. 61/255,080, filed on Oct. 26, 2009, provisional application No. 61/255,085, filed on Oct. 26, 2009.

(51) Int. Cl.
*H01L 21/82* (2006.01)

(52) U.S. Cl.
USPC ........... 438/128; 438/702; 438/669; 438/671; 438/703; 257/211; 257/296; 257/390

(58) Field of Classification Search
USPC ........... 438/702, 286, 669, 671, 694, 689, 42, 438/39, 696, 703, 128, 587; 257/390, 391, 257/314, 315, 316, E27.084, E27.085, 202, 257/208, 209, 211, 296, 300
See application file for complete search history.

(56) References Cited

U.S. PATENT DOCUMENTS

| | | | |
|---|---|---|---|
| 5,915,167 | A | 6/1999 | Leedy |
| 5,977,638 | A | 11/1999 | Rodgers et al. |
| 6,952,030 | B2 | 10/2005 | Herner et al. |
| 7,405,465 | B2 | 7/2008 | Herner |
| 7,767,499 | B2 | 8/2010 | Herner |
| 2004/0235309 | A1 | 11/2004 | Hsu |
| 2005/0127519 | A1 | 6/2005 | Scheuerlein et al. |
| 2005/0179134 | A1 | 8/2005 | Matsubara |
| 2005/0245008 | A1 | 11/2005 | Doris et al. |
| 2006/0154463 | A1 | 7/2006 | Furukawa et al. |

(Continued)

FOREIGN PATENT DOCUMENTS

| WO | WO 2008/008630 | 1/2008 |
|---|---|---|
| WO | WO 2009/101878 | 8/2009 |

OTHER PUBLICATIONS

U.S. Appl. No. 12/911,887, filed Oct. 26, 2010.
U.S. Appl. No. 12/911,900, filed Oct. 26, 2010.

(Continued)

*Primary Examiner* — Thanh Y Tran
(74) *Attorney, Agent, or Firm* — Dugan & Dugan, PC

(57) ABSTRACT

The present invention provides apparatus, methods, and systems for fabricating memory structures methods of forming pillars for memory cells using sequential sidewall patterning. The invention includes forming first features from a first template layer disposed above a memory layer stack; forming first sidewall spacers adjacent the first features; forming second features that extend in a first direction in a mask layer by using the first sidewall spacers as a hardmask; depositing a second template layer on the mask layer; forming third features from the second template layer; forming second sidewall spacers adjacent the third features; and forming fourth features that extend in a second direction in the mask layer by using the second sidewall spacers as a hardmask. Numerous additional aspects are disclosed.

16 Claims, 32 Drawing Sheets

(56) References Cited

U.S. PATENT DOCUMENTS

| | | |
|---|---|---|
| 2006/0250836 A1 | 11/2006 | Herner et al. |
| 2006/0263699 A1 | 11/2006 | Abatchev et al. |
| 2007/0049011 A1 | 3/2007 | Tran |
| 2007/0138535 A1 | 6/2007 | Higashitani |
| 2007/0205443 A1* | 9/2007 | Juengling .................... 257/288 |
| 2007/0215874 A1 | 9/2007 | Furukawa et al. |
| 2007/0228498 A1* | 10/2007 | Toba et al. .................... 257/411 |
| 2008/0017996 A1 | 1/2008 | Sato et al. |
| 2008/0171406 A1 | 7/2008 | Orimoto et al. |
| 2008/0318381 A1 | 12/2008 | Matamis et al. |
| 2009/0075485 A1 | 3/2009 | Ban et al. |
| 2009/0087990 A1 | 4/2009 | Yatsuda et al. |
| 2009/0166682 A1 | 7/2009 | Scheuerlein |
| 2009/0168480 A1 | 7/2009 | Scheuerlein et al. |
| 2009/0200583 A1 | 8/2009 | Marokkey et al. |
| 2009/0202952 A1 | 8/2009 | Abraham et al. |
| 2009/0263749 A1 | 10/2009 | Sim et al. |
| 2009/0302472 A1 | 12/2009 | Yoon |

OTHER PUBLICATIONS

International Search Report and Written Opinion of related International Application No. PCT/US2010/054027 dated Oct. 17, 2011.

* cited by examiner

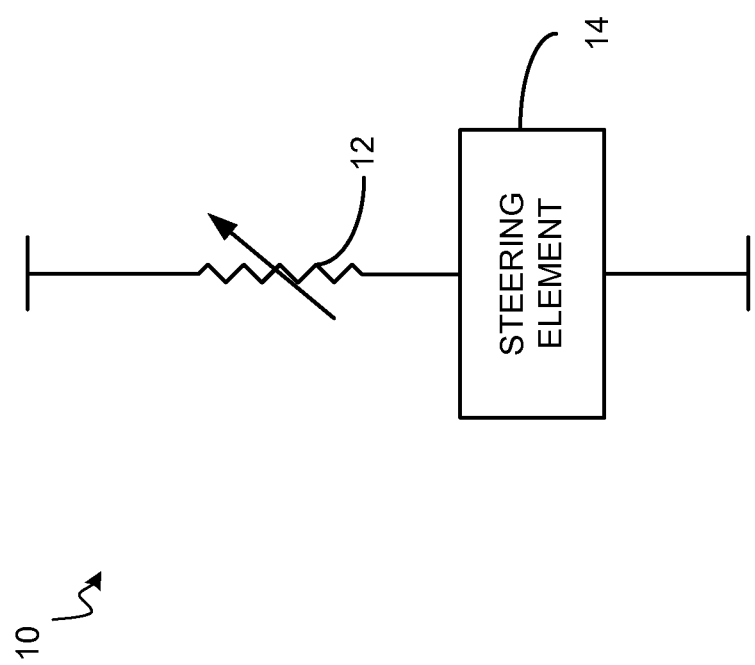

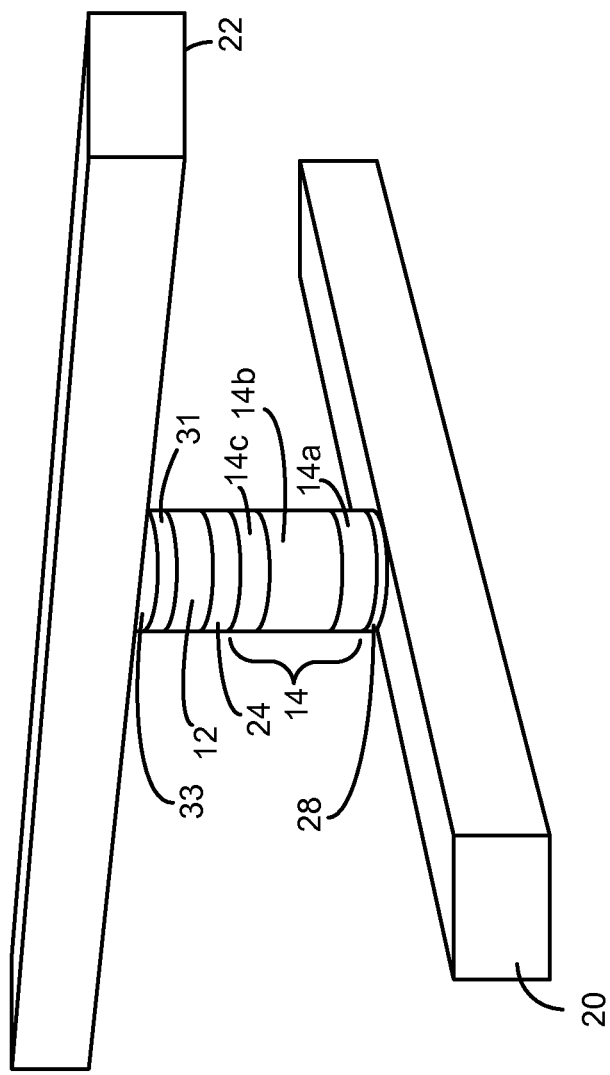

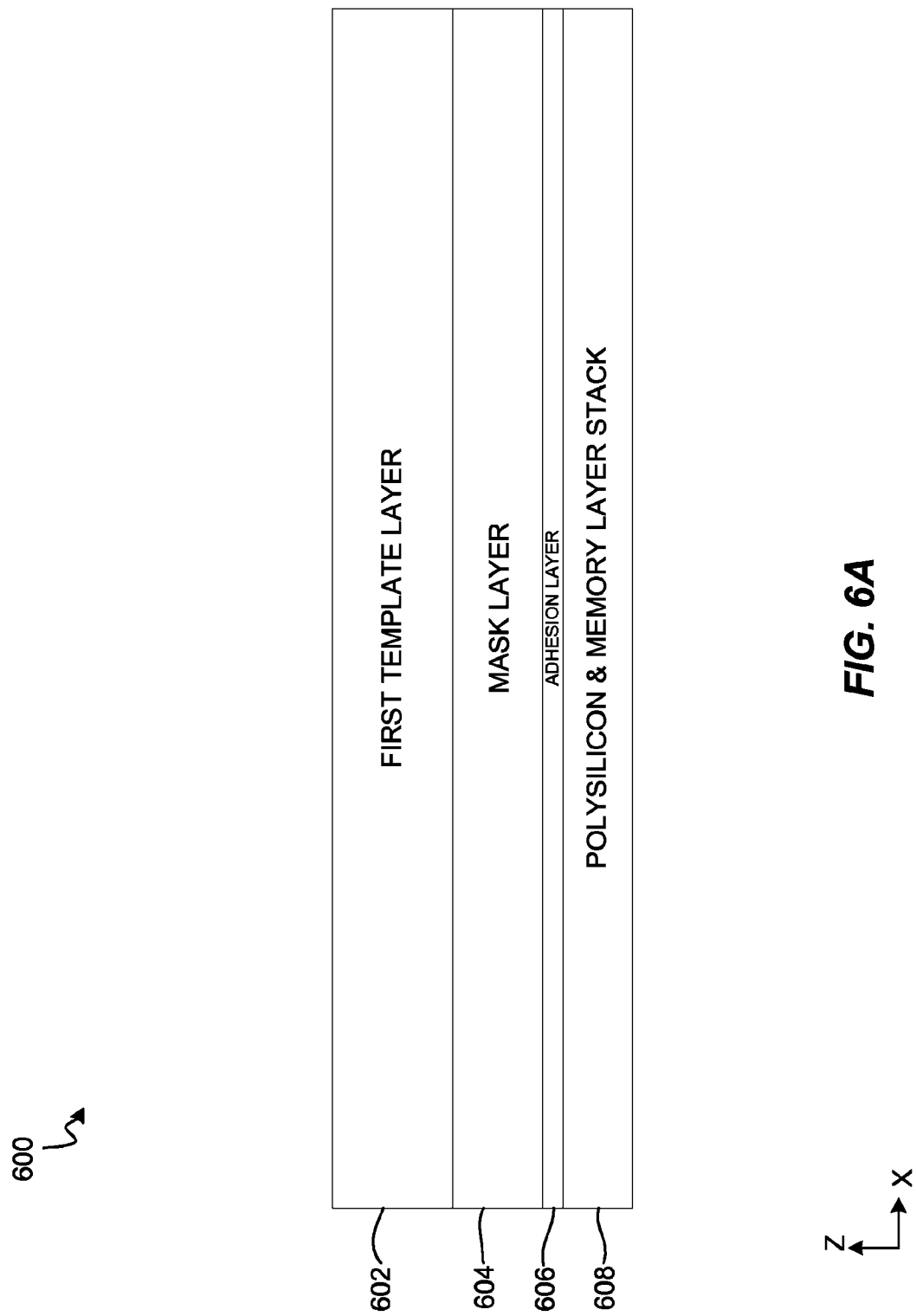

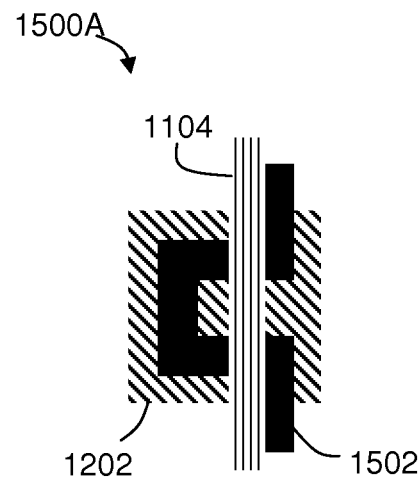
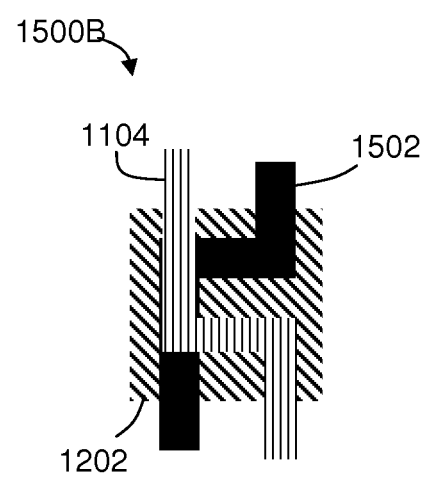
FIG. 12A   FIG. 12B
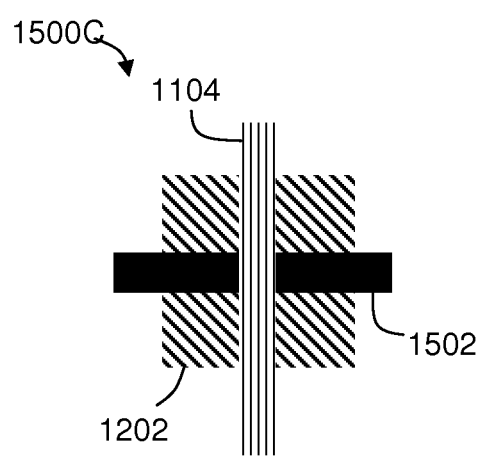
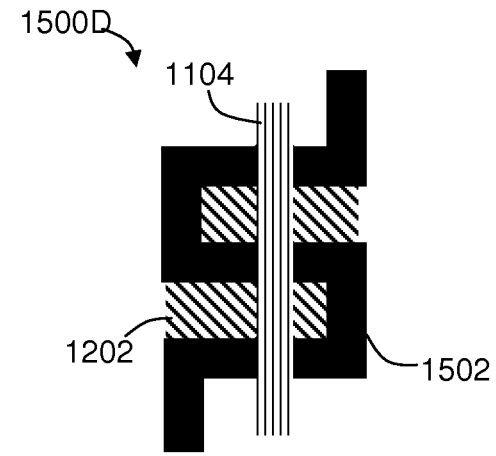
FIG. 12C   FIG. 12D

US 8,741,696 B2

METHODS OF FORMING PILLARS FOR MEMORY CELLS USING SEQUENTIAL SIDEWALL PATTERNING

CROSS-REFERENCE TO RELATED APPLICATIONS

The present application claims priority to U.S. Provisional Patent Application No. 61/255,080, filed Oct. 26, 2009, entitled "DOUBLE SIDEWALL PATTERNING FOR 4× HALF PITCH RELIEF PATTERNING", which is hereby incorporated by reference in its entirety for all purposes. The present application also claims priority to U.S. Provisional Patent Application No. 61/255,085, filed Oct. 26, 2009, entitled "LAYOUT OF 3D MATRIX ARRAY MEMORY FOR REDUCED COST PATTERNING", which is hereby incorporated by reference in its entirety for all purposes.

The present application is also related to U.S. patent application Ser. No. 12/911,887 filed on Oct. 26, 2010, and titled "APPARATUS AND METHODS OF FORMING MEMORY LINES AND STRUCTURES USING DOUBLE SIDEWALL PATTERNING FOR FOUR TIMES HALF PITCH RELIEF PATTERNING" which is incorporated by reference herein in its entirety for all purposes.

The present application is also related to U.S. patent application Ser. No. 12/911,900 filed on Oct. 26, 2010, and titled "METHODS AND APPARATUS FOR LAYOUT OF THREE DIMENSIONAL MATRIX ARRAY MEMORY FOR REDUCED COST PATTERNING" which is incorporated by reference herein in its entirety for all purposes.

FIELD OF THE INVENTION

The present invention relates to non-volatile memories, and more particularly to a method of forming pillars for memory cells by sequential sidewall patterning.

BACKGROUND

The fabrication of a memory device typically requires a number of steps including lithography, deposition of various constituent materials, patterning, etching, etc. However, the continual reduction in the size of individual memory elements, and the continual increase in the density with which such memory elements are fabricated on memory devices, are challenging the limits of current lithography and patterning technology. For example, existing lithography and patterning technology is typically not well suited for forming features having a pitch less than about 32 nanometers. Available techniques are relatively expensive and require expensive processes such as immersion lithography, extreme-ultraviolet lithography (EUVL), and/or electron beam (e-beam) direct writing lithography. Accordingly, improved and more cost effective methods of patterning memory cells for use in memory devices are desirable. In particular, methods and apparatus for forming memory elements having small pitch, are desirable.

SUMMARY

In some embodiments, the present invention provides methods of forming a mask for a memory pillar array. The methods include forming first features from a first template layer disposed above a memory layer stack; forming first sidewall spacers adjacent the first features; forming second features that extend in a first direction in a mask layer by using the first sidewall spacers as a hardmask; depositing a second template layer on the mask layer; forming third features from the second template layer; forming second sidewall spacers adjacent the third features; and forming fourth features that extend in a second direction in the mask layer by using the second sidewall spacers as a hardmask.

In some other embodiments, the present invention provides a mask for a memory pillar array. The mask includes a structure formed with first features formed from a first template layer disposed above a memory layer stack, first sidewall spacers formed adjacent the first features, second features that extend in a first direction in a mask layer formed by using the first sidewall spacers as a hardmask, a second template layer deposited on the mask layer, third features formed from the second template layer, second sidewall spacers formed adjacent the third features, and fourth features that extend in a second direction in the mask layer formed by using the second sidewall spacers as a hardmask.

In some embodiments, the present invention provides methods of forming a mask for a memory pillar array. The methods include forming first features from a first template layer disposed above a memory layer stack; forming first sidewall spacers adjacent the first features; forming second features from a second template layer using the first sidewall spacers as a hardmask; forming second sidewall spacers adjacent the second features; forming third features that extend in a first direction in a mask layer by using the second sidewall spacers as a hardmask; depositing a third and fourth template layer on the mask layer; forming fourth features from a third template layer; forming third sidewall spacers adjacent the fourth features; forming fifth features from the fourth template layer using the third sidewall spacers as a hardmask; forming fourth sidewall spacers adjacent the fifth features; and forming sixth features that extend in a second direction in the mask layer by using the fourth sidewall spacers as a hardmask.

In some other embodiments, the present invention provides a mask for a memory pillar array. The mask includes a structure formed with first features formed from a first template layer disposed above a memory layer stack, first sidewall spacers formed adjacent the first features, second features formed from a second template layer using the first sidewall spacers as a hardmask, second sidewall spacers formed adjacent the second features, third features that extend in a first direction in a mask layer formed by using the second sidewall spacers as a hardmask, a third and fourth template layer deposited on the mask layer, fourth features formed from a third template layer, third sidewall spacers formed adjacent the fourth features, fifth features formed from the fourth template layer using the third sidewall spacers as a hardmask, fourth sidewall spacers formed adjacent the fifth features, and sixth features that extend in a second direction in the mask layer formed by using the fourth sidewall spacers as a hardmask.

In some other embodiments, the present invention provides memory cell arrays formed using the masks described above.

Numerous additional embodiments are described below with respect to the following drawings.

BRIEF DESCRIPTION OF THE DRAWINGS

Features of the present invention can be more clearly understood from the following detailed description considered in conjunction with the following drawings, in which the same reference numerals denote the same elements throughout.

FIG. 1 is a diagram of an exemplary memory cell in accordance with embodiments of the present invention.

FIG. 2A is a simplified perspective view of an exemplary memory cell in accordance with embodiments of the present invention.

FIGS. 6A through 6F illustrate a third sequence of cross-sectional views of a portion of a substrate during an exemplary fabrication of a feature in accordance with embodiments of the present invention.

FIGS. 12A to 12D are schematic drawings of example arrangements of memory lines of different wiring layers intersecting at contact pads/vias according to some embodiments of the present invention.

DETAILED DESCRIPTION

Figure 2B:
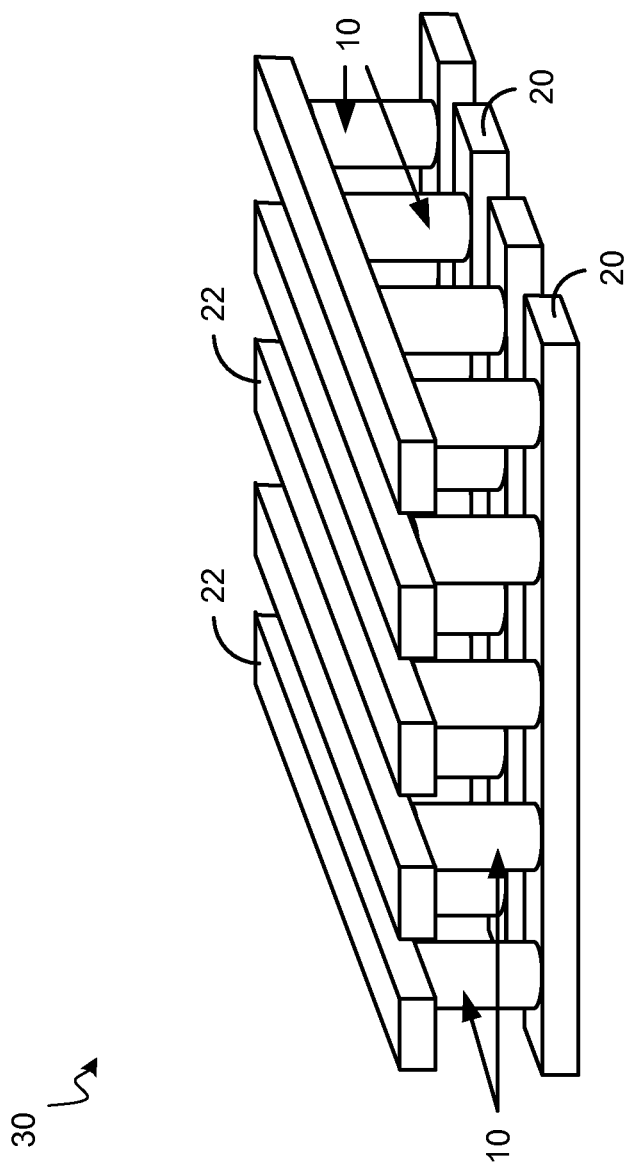
FIG. 2B is a simplified perspective view of a portion of a first exemplary memory level formed from a plurality of the memory cells of FIG. 2A.

The present invention facilitates manufacturing cost reduction of submicron three dimensional memory arrays. In particular, the present invention provides methods that avoid having to use immersion lithography, EUVL, or e-beam direct write lithography methods (e.g., each of which are relatively expensive) to form memory array structures with a half-pitch (HP) dimension below approximately 30 nm.

In some embodiments of the present invention, methods are provided that can be used to reduce the half pitch dimension by 2× and in other embodiments, a 4× reduction in half pitch can be realized. Thus, using the sequential sidewall patterning methods of the present invention, cost efficient 32 nm lithography can be used to achieve memory structures (e.g., memory cell pillars) down to approximately an 8 nm half pitch dimension or less. Note that in terms of current technology, this improvement represents an extension of 32 nm lithography of five generations: from 32 nm to 22 nm to 16 nm to 11 nm to 8 nm. However, it will be understood that the present invention may be used to extend future technologies as well.

In an exemplary embodiment in accordance with the present invention, a mask for forming an array of memory cell pillars having a pitch smaller than the minimum pitch associated with available lithography technology (i.e., the "minimum pitch" without using, for example, EUVL or e-beam direct write lithography) is formed using sequential sidewall patterning.

Initially, a first template layer (e.g., $Si_3N_4$) is formed above a mask layer (e.g., tungsten (W)) which has been deposited on an inter-layer dielectric (ILD) (e.g., polysilicon) and a memory stack (e.g., several layers of various materials used to form memory cells when patterned). An optional etch stop layer (e.g., $SiO_2$) may be deposited between the template layer and the mask layer and an optional adhesion layer may be deposited between the mask layer and the ILD/memory stack.

In some embodiments, lines (or other features) are patterned in the first template layer using conventional lithography (e.g., 32 nm technology) having a minimum pitch commensurate with the available lithography and patterning technology. A sidewall hardmask is formed on the sides of the line features formed in the first template layer. The sidewall hardmask includes sidewall spacers on either side of each of the first template layer line structures. The sidewall hardmask has a pitch that is smaller than the minimum pitch of the original line pattern, e.g., approximately half the pitch of the original line pattern.

Next, the "half-pitch" sidewall hardmask is used to pattern the mask layer into half-pitch line features. Dielectric gap fill material is deposited between the half-pitch line features and a planarization process is used to level the structure.

A second template layer (e.g., $Si_3N_4$) is then formed on the planarized mask layer. Optionally, an adhesion layer may be deposited between the template layer and the mask layer. The patterning process described above with respect to the first template layer is then repeated on the second template layer but rotated approximately ninety degrees. In other words, using the same process described above with respect to the first template layer, a second "half-pitch" sidewall hardmask is formed with line features running approximately perpendicular to the first "half-pitch" sidewall hardmask.

Figure 7:
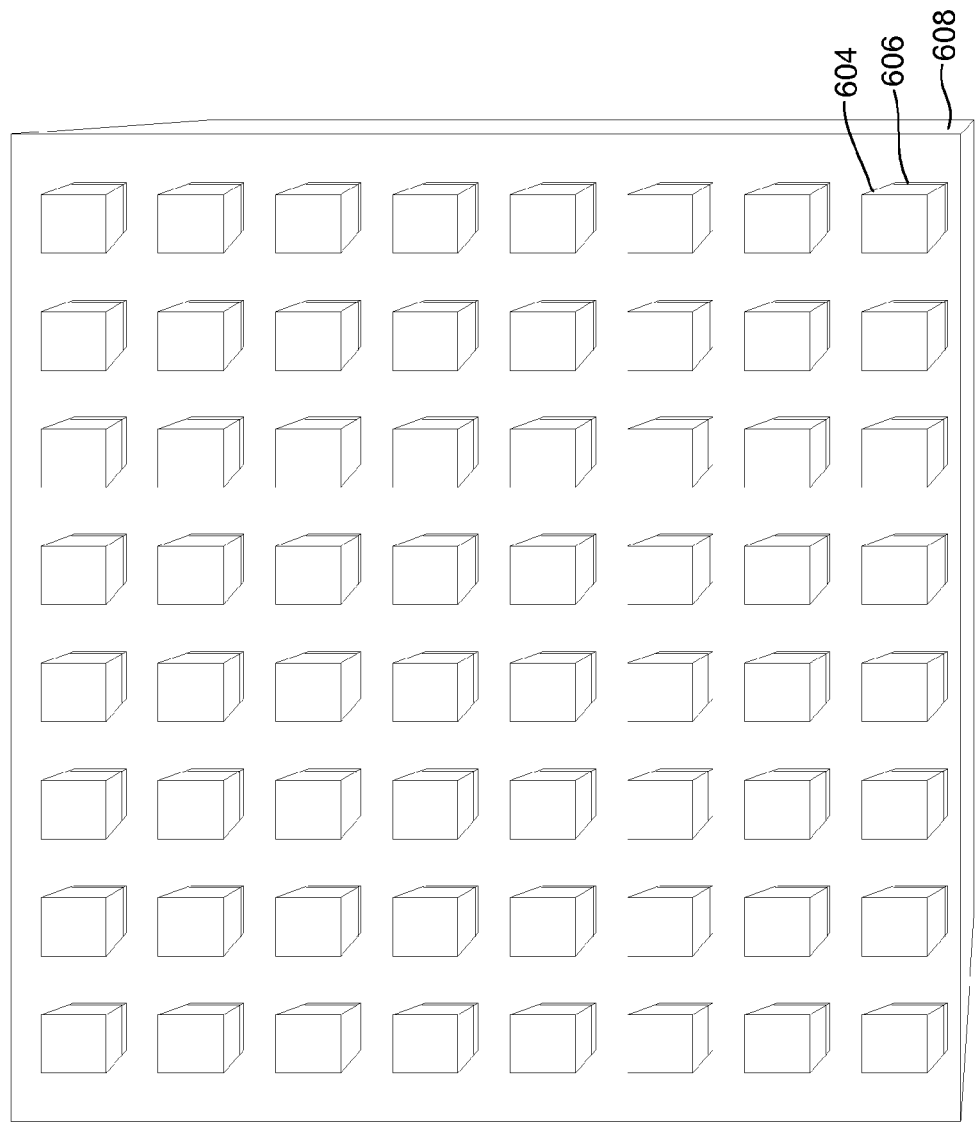
FIG. 7 is a top perspective view of an example embodiment of the mask structure formed by the exemplary process depicted in FIGS. 6A through 6F.

Next, the second "half-pitch" sidewall hardmask is used to pattern the mask layer into an array of half-pitch rectangular prism-shaped pillar features as depicted in FIG. 7 and described in more detail below. The mask layer may then be used to form an array of half-pitch rectangular prism-shaped memory cell pillars by etching the underlying ILD/memory stack not covered by the patterned mask layer.

In alternative embodiments, a double sequential sidewall patterning process may be used in two dimensions in place of the single sequential sidewall patterning process used in two dimensions described above. The result is a mask layer patterned into a quarter-pitch array which can be used to form an array of quarter-pitch rectangular prism-shaped memory cell pillars. In other words, the present invention may be used to form a memory array with "4×" half pitch relief.

FIG. 1 depicts a schematic illustration of an exemplary memory cell 10 in accordance with this invention. Memory cell 10 includes a reversible resistance switching element 12 coupled to a steering element 14. Reversible resistance switching element 12 includes a reversible resistivity switching material (not separately shown) having a resistivity that may be reversibly switched between two or more states.

For example, reversible resistivity switching material of element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, reversible resistance switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, metal-insulator-metal tunneling current device, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance switching element 12 and steering element 14 are described below with reference to FIGS. 2A-2D and FIG. 3.

FIG. 2A is a simplified perspective view of an exemplary embodiment of a memory cell 10 in accordance with this invention in which steering element 14 is a diode. Memory cell 10 includes a reversible resistance switching element 12 coupled in series with a diode 14 between a first conductor 20 and a second conductor 22. In some embodiments, a barrier layer 24 may be formed between reversible resistance switching element 12 and diode 14, and barrier layers 31 and 33 may be formed between reversible resistance switching element 12 and second conductor 22. An additional barrier layer 28 may be formed between diode 14 and first conductor 20. For example, barrier layers 24, 28, 31 and 33 may include titanium nitride, tantalum nitride, tungsten nitride, or another similar barrier layer material.

Diode 14 may include any suitable diode such as a vertical polycrystalline p-n or p-i-n diode, whether upward pointing with an n-region above a p-region of the diode or downward pointing with a p-region above an n-region of the diode. Exemplary embodiments of diode 14 are described below with reference to FIG. 3.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

FIG. 2B is a simplified perspective view of a portion of a first memory level 30 formed from a plurality of memory cells 10, such as memory cells 10 of FIG. 2A. For simplicity, reversible resistance switching element 12, diode 14, and barrier layers 24, 28, 31 and 33 are not separately shown. Memory array 30 is a "cross-point" array including a plurality of bit lines (second conductors 22) and word lines (first conductors 20) to which multiple memory cells are coupled (as shown). In the exemplary embodiment, first conductor 20 and second conductor 22 are regularly spaced at a pitch between about 16 nm and about 8 nm, more generally between about 22 nm and about 3 nm. Other memory array configurations may be used, as may multiple levels of memory.

Figure 2C:
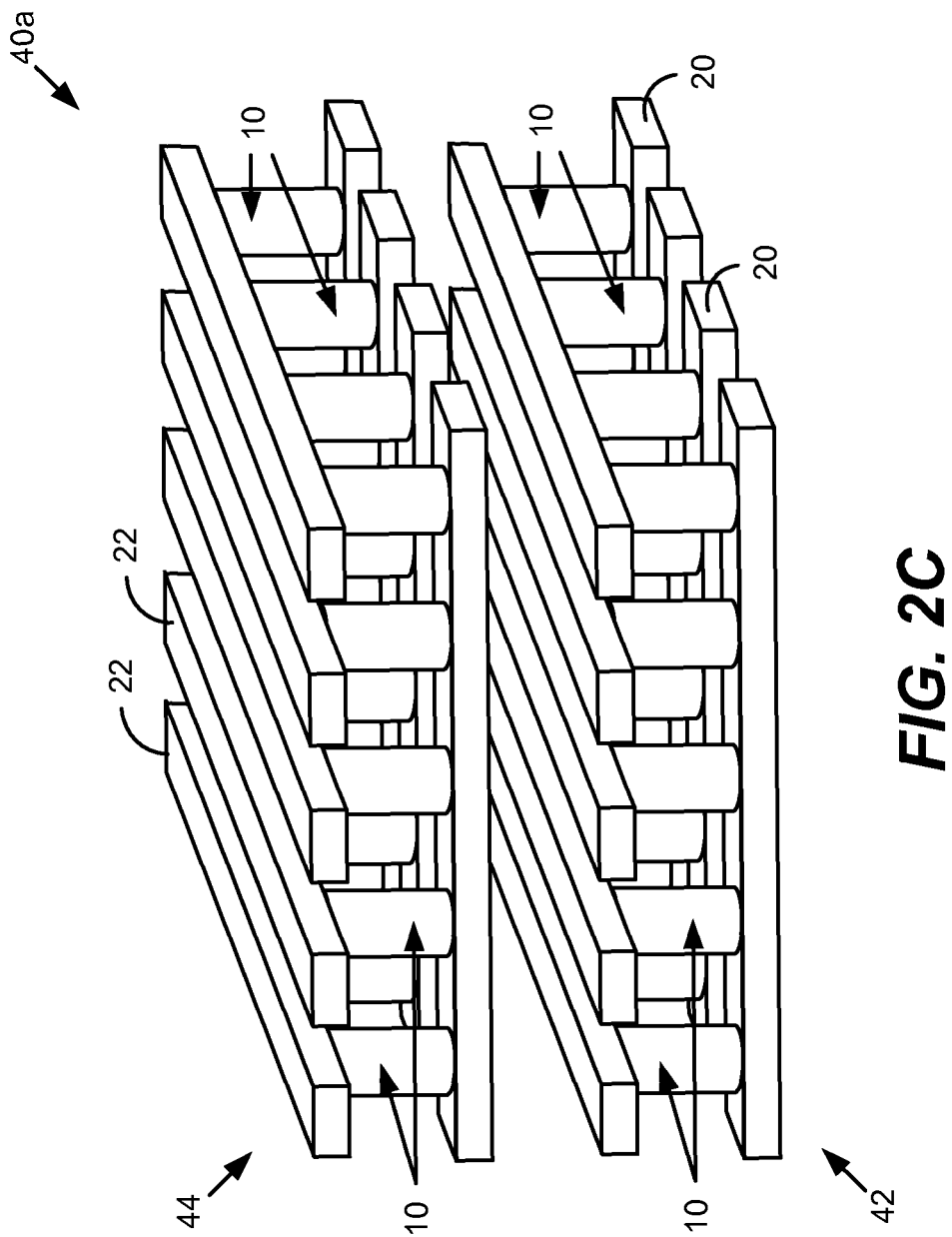
FIG. 2C is a simplified perspective view of a portion of a first exemplary three-dimensional memory array in accordance with embodiments of the present invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an inter-level dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
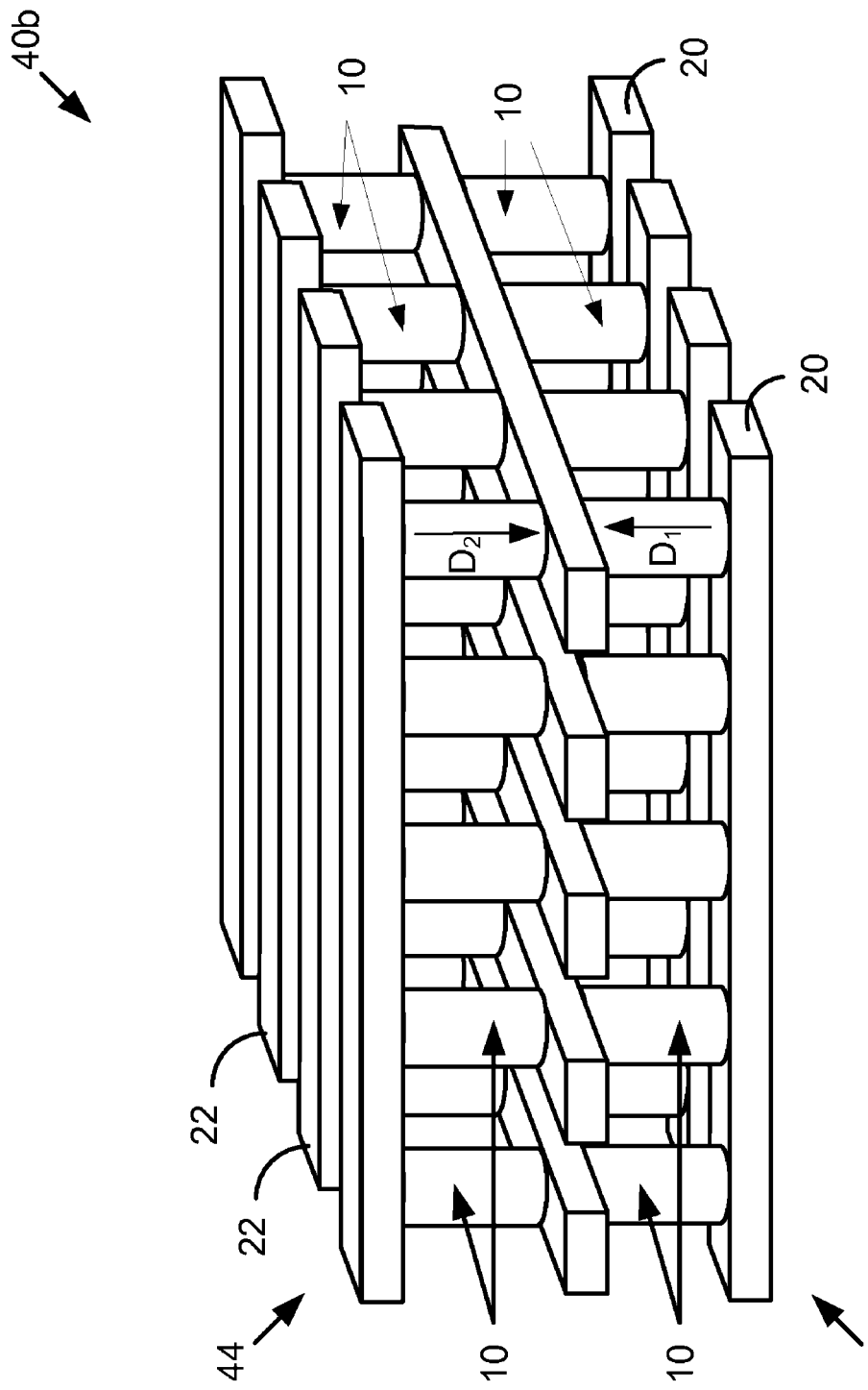
FIG. 2D is a simplified perspective view of a portion of a second exemplary three-dimensional memory array in accordance with embodiments of the present invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
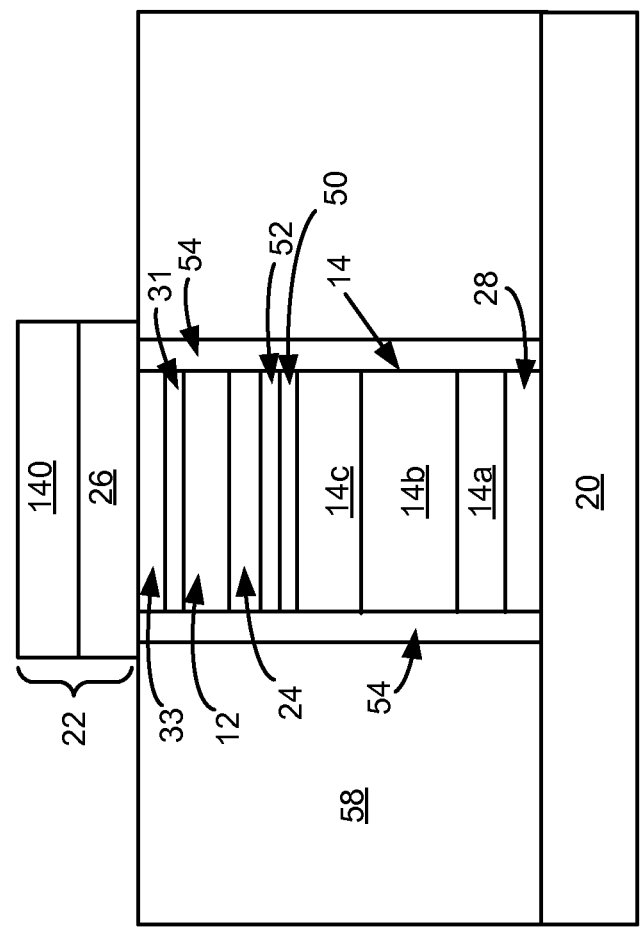
FIG. 3 is a cross-sectional view of an exemplary embodiment of a memory cell in accordance with embodiments of the present invention.

FIG. 3 is a cross-sectional view of an exemplary embodiment of memory cell 10 of FIG. 2A. In particular, memory cell 10 may include a carbon-based reversible resistance switching element 12 (referred to in the remaining description as "carbon layer 12"), diode 14, and first and second conductors 20 and 22, respectively. Memory cell 10 also may include barrier layers 24, 28, 31, and 33, a silicide layer 50, a silicide-forming metal layer 52, and dielectric layer 58, as well as adhesion layers, antireflective coating layers and/or the like (not shown) which may be used with first and/or second conductors 20 and 22, respectively, to improve device performance and/or facilitate device fabrication. Memory cell 10 also may include one or more sidewall liners 54.

As previously stated, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes. In some embodiments, a few hundred angstroms or less of silicon-germanium alloy with about 10 at % or more of germanium may be employed.

Barrier layer 28, such as titanium nitride, tantalum nitride, tungsten nitride, or other similar barrier layer material, may be formed between first conductor 20 and n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14c.

Following formation of silicide-forming metal layer 52, an RTA step may be performed at about 540° C. for about one minute to form silicide layer 50, consuming all or a portion of the silicide-forming metal layer 52. Following the RTA step, any residual nitride layer from silicide-forming metal layer 52 may be stripped using a wet chemistry, as described above, and as is known in the art.

Barrier layer 24, including titanium nitride, tantalum nitride, tungsten nitride, or another similar barrier layer material, may be formed above silicide-forming metal layer 52.

Carbon layer 12 includes a carbon-based material. For example, carbon layer 12 may include amorphous carbon ("aC"). In other embodiments, carbon layer 12 may include graphene, graphite, carbon nano-tube materials, amorphous diamond-like carbon, etc.

Barrier layers 31 and 33, which may include titanium nitride, tantalum nitride, tungsten nitride, or another similar barrier layer material, may be formed above carbon layer 12.

Figure 4A:
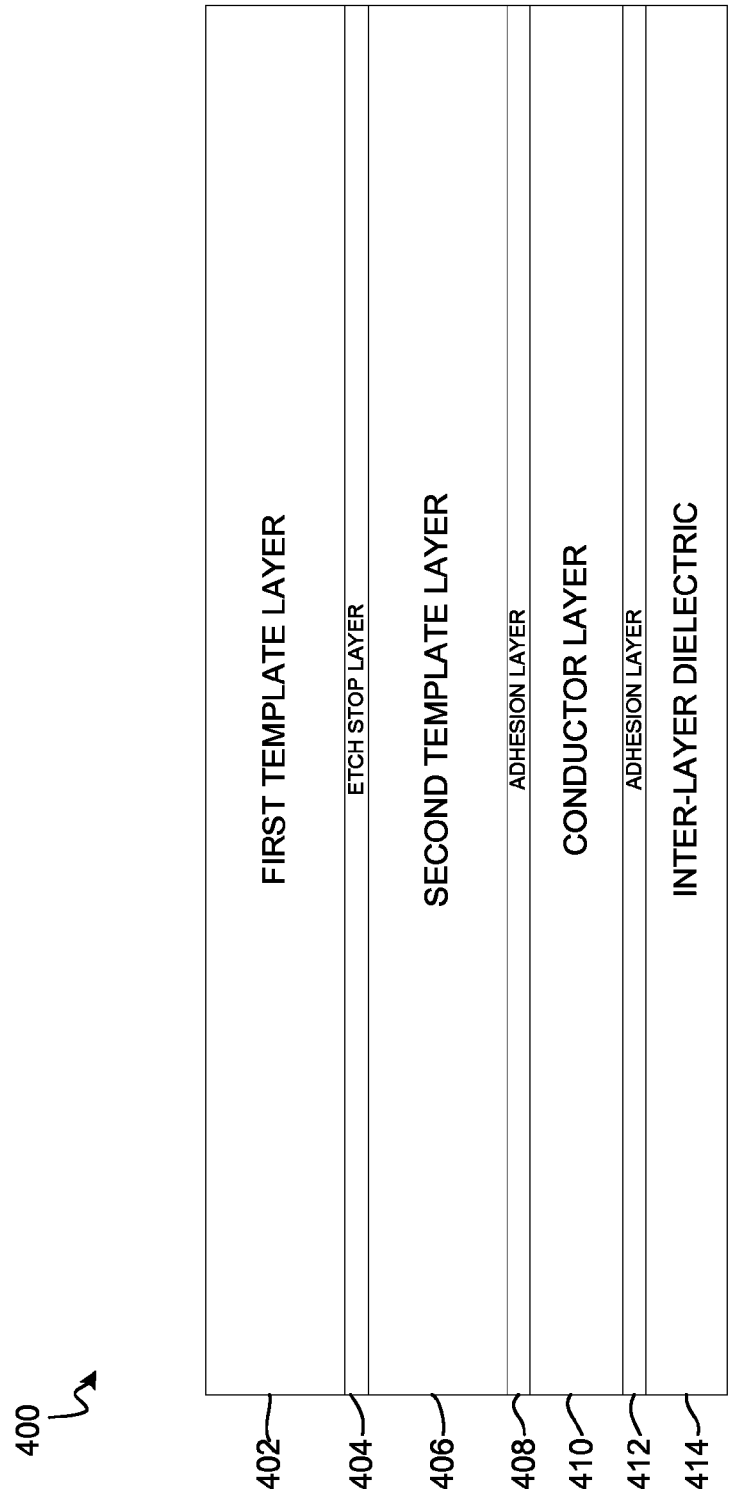
FIGS. 4A through 4F illustrate a first sequence of cross-sectional views of a portion of a substrate during an exemplary fabrication of a feature in accordance with embodiments of the present invention.

In accordance with exemplary embodiments of the invention, substantially parallel, substantially co-planar memory lines or rails may be formed using a sequential sidewall patterning process depicted in FIGS. 4A to 4F. FIG. 4A depicts the cross-section of an example stack of layers 400 that may be used in the double sidewall patterning process of the present invention. As shown, a first template layer 402 is deposited on an etch stop layer 404. The etch stop layer 404 is on a second template layer 406 which is formed on either an optional adhesion layer 408 or directly on a conductive layer 410. The conductive layer 410 is formed on an adhesion layer 412 which is bound to an inter-layer dielectric 414. As indicated above, other memory and/or wiring layers may be formed above and below the layer stack 400.

The first and second template layers 402, 406 may be silicon nitride ($Si_3N_4$) or any practicable template material. These layers may be between approximately 50 nm and approximately 500 nm thick. The etch stop layer 404 may be silicon dioxide ($SiO_2$) or any practicable etch stop material and may be between approximately 10 nm and approximately 200 nm thick. The adhesion layers 408, 412 may be titanium nitride (TiN), tantalum nitride (TaN), tungsten nitride (WN) or any practicable adhesion material and may be between approximately 20 to approximately 500 angstroms, and preferably approximately 100 angstroms thick. Other adhesion layer materials and/or thicknesses may be employed. In some embodiments, adhesion layers 408, 412 may be optional.

Conductive layer 410 may include any suitable conductive material such as tungsten (W) or another appropriate metal, heavily doped semiconductor material, a conductive silicide, a conductive silicide-germanide, a conductive germanide, or any practicable wiring material deposited by any suitable method (e.g., chemical vapor deposition ("CVD"), physical vapor deposition ("PVD"), etc.). In at least one embodiment, conductive layer 106 may be approximately 200 to approximately 2500 angstroms of tungsten thick. Other conductive layer materials and/or thicknesses may be used.

Figure 4B:
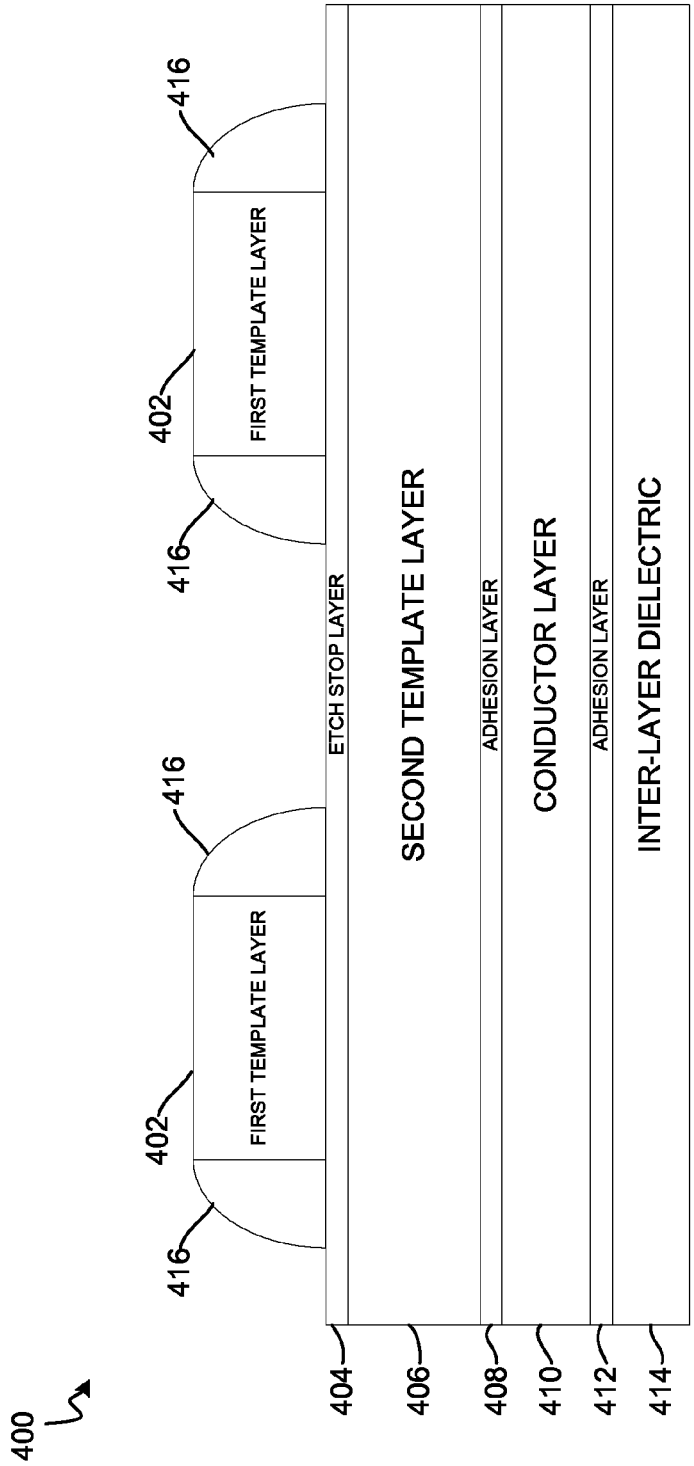
Figure 4C:
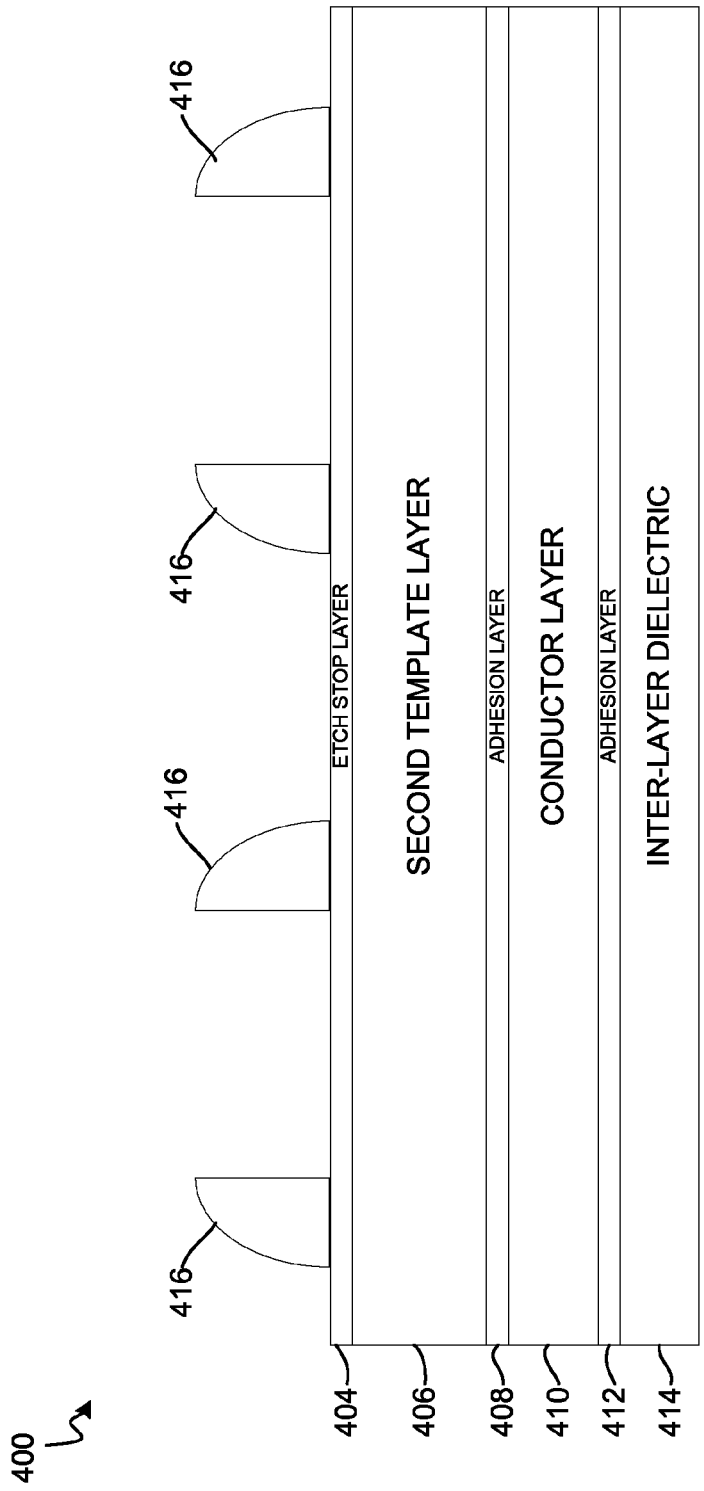

Turning to FIG. 4B, the first template layer 402 is patterned with rails/lines (or other features) using conventional lithography (e.g., 32 nm technology) having the minimum pitch commensurate with the available lithography and patterning technology. The line features shown in FIG. 4B extend into and out of the page, and are shown in cross-section. Next, by depositing a conformal liner of, for example, polysilicon and performing an isotropic etch step, a sidewall hardmask 416 is formed on the sides of the line features patterned in the first template layer 402. The resulting sidewall hardmask 416 includes sidewall spacers on either side of the first template layer 402 line features as shown in FIG. 4B. The sidewall hardmask 416 has a pitch that is smaller than the minimum pitch of the original line pattern, e.g., approximately half the pitch of the original line pattern. The sidewall spacers are separated by spaces having a width greater than one-half the minimum pitch. For example, the ratio of the width of the spaces to the width of the line features may be about 3:1. Polysilicon or any practicable material may be used to form the sidewall hardmask 416. A wet etch process may then be used to remove the remaining first template layer 402 (i.e., the line features) between the sidewall hardmask 416 spacers as shown in FIG. 4C. In some embodiments, the second template layer 406 may optionally be $SiO_2$ or have a similar etch rate ratio to the first template layer 402 so that an etch stop layer 404 is not necessary.

Figure 4D:
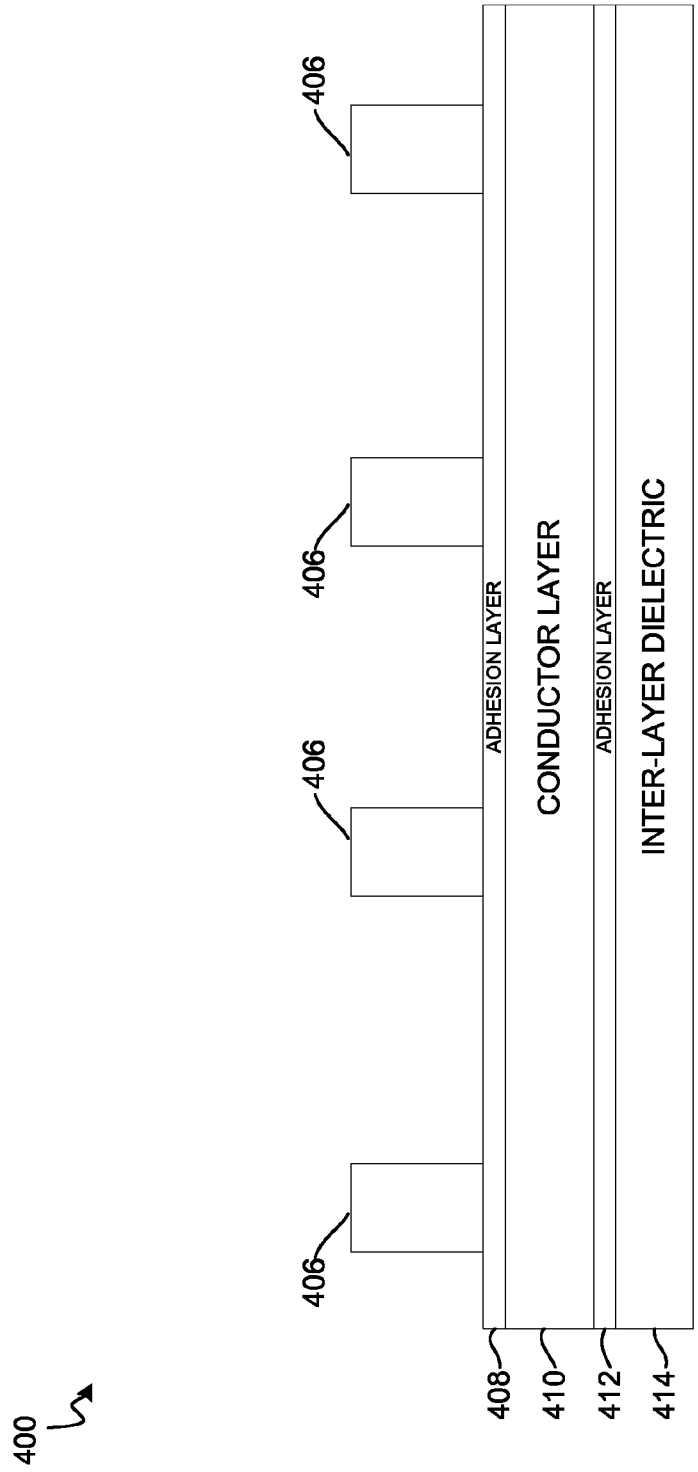
Figure 4E:
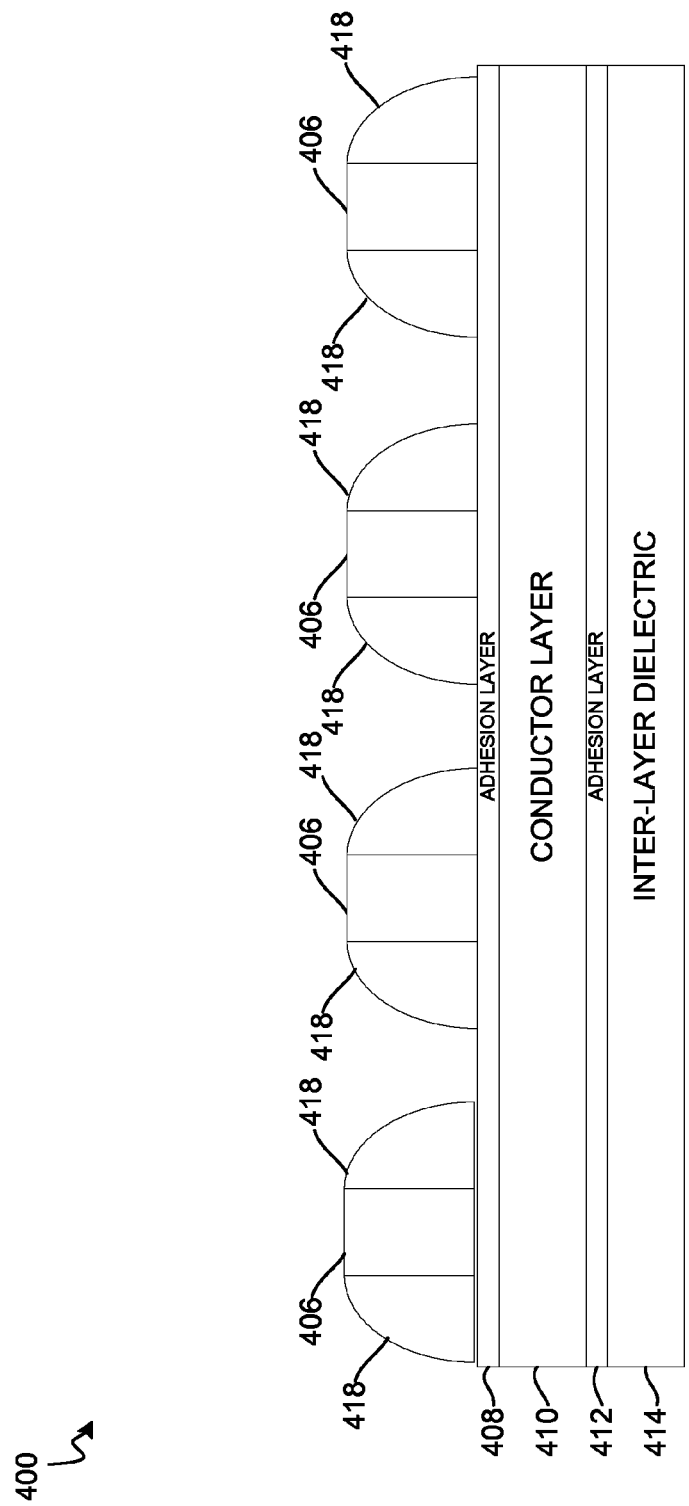

Next, the "half-pitch" sidewall hardmask 416 is used to pattern the second template layer 406 into half-pitch lines as shown in FIG. 4D. Once again by depositing a conformal liner and performing an isotropic etch step, a sidewall hardmask 418 is formed on the sides of the lines patterned in the second template layer 406. The resulting sidewall hardmask 418 includes sidewall spacers on either side of the second template layer 406 line structures as shown in FIG. 4E. This second sidewall hardmask 418 has a smaller pitch than the pitch of the "half-pitch" sidewall hardmask 416, e.g., approximately one-quarter the pitch of the original line pattern. A wet etch process may then be used to remove the remaining second template layer 406 between the sidewall hardmask 418.

Figure 4F:
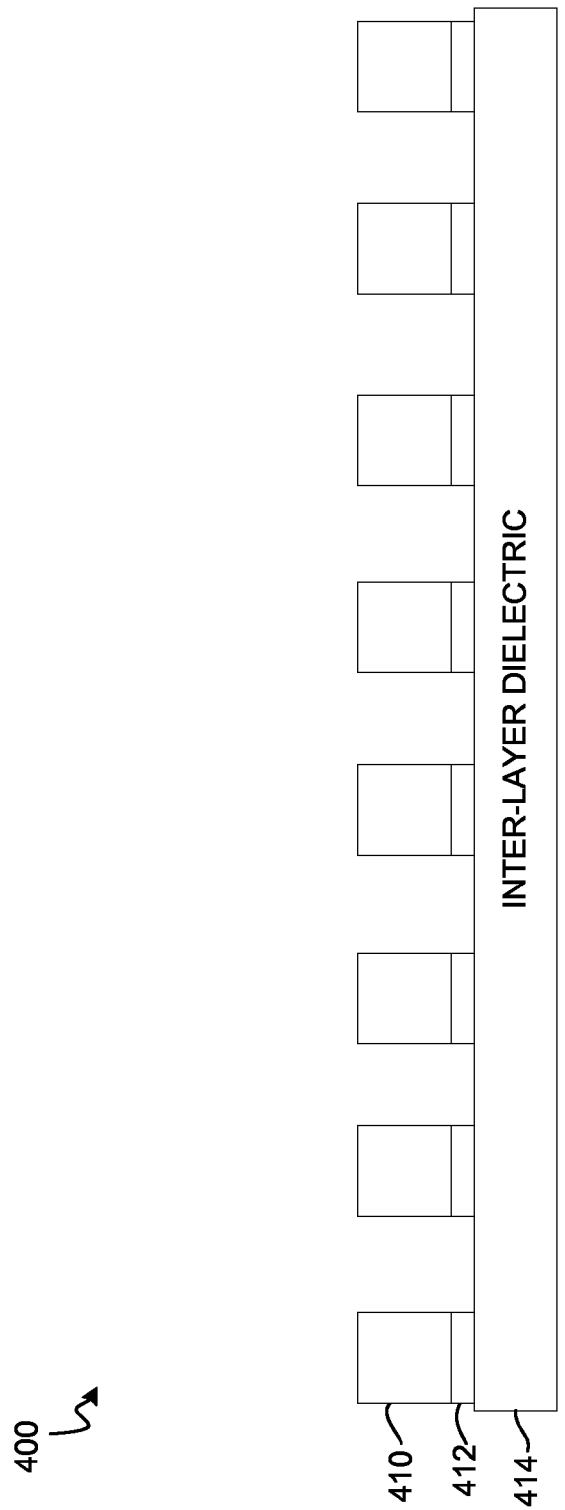

The "quarter-pitch" sidewall hardmask 418 may then be used to etch the conductor layer 410 to form quarter pitch structures such as memory lines (e.g., bit and word lines) as shown in FIG. 4F. A dielectric gap fill material $SiO_2$ may then be deposited and a planarization process may be used to level the four times HP relief patterned features. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 5A:
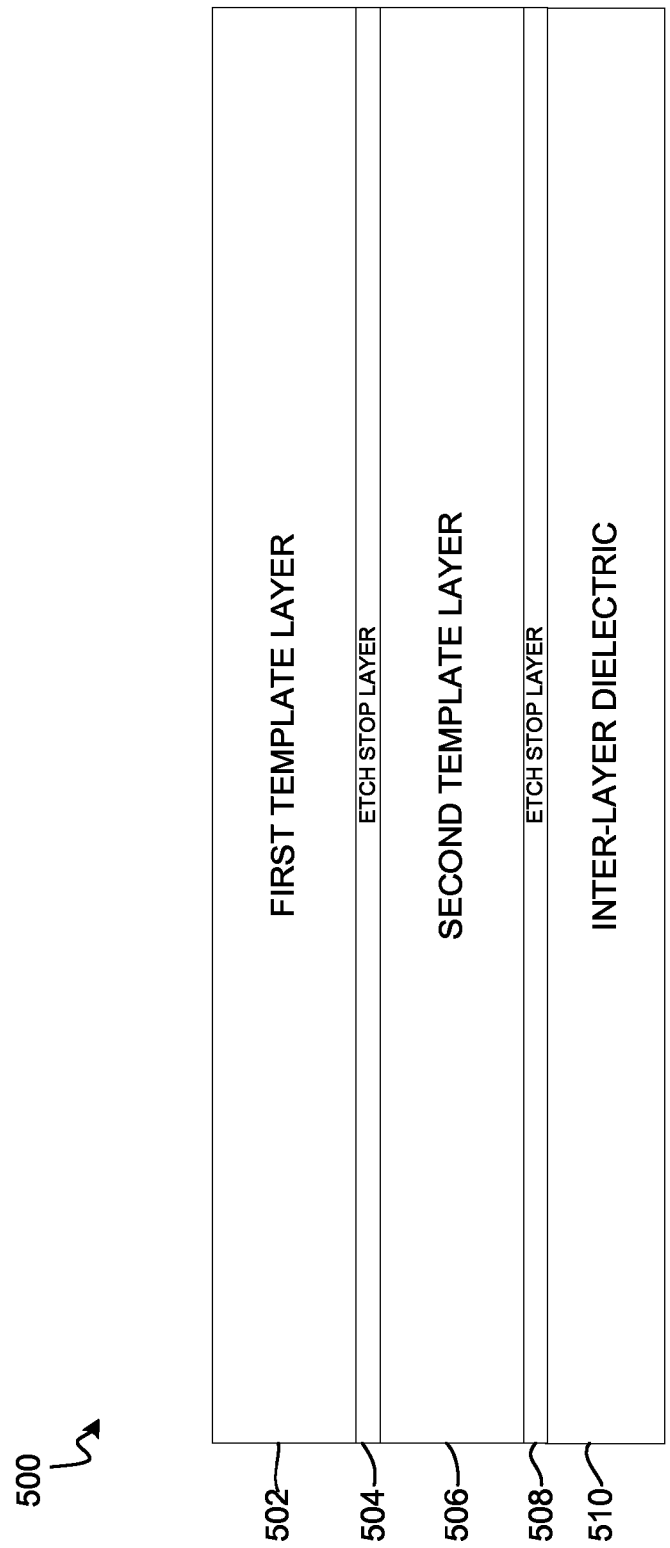
FIGS. 5A through 5F illustrate a second sequence of cross-sectional views of a portion of a substrate during an exemplary fabrication of a feature in accordance with embodiments of the present invention.

Turning now to FIGS. 5A to 5F, a second example process for forming substantially parallel, substantially co-planar memory lines or rails using a sequential sidewall patterning process according to the present invention is illustrated. FIG. 5A depicts the cross-section of an example stack of layers 500 that may be used to in a double sidewall patterning process of the present invention. As shown, a first template layer 502 is deposited on an etch stop layer 504. The etch stop layer 504 is on a second template layer 506 which is formed on and second etch stop layer 508. The second etch stop layer 508 is formed on an inter-layer dielectric 510. As indicated above, other memory and/or wiring layers may be formed above and below the layer stack 500.

The first and second template layers 502, 506 may be silicon nitride ($Si_3N_4$) or any practicable template material. These layers may be between approximately 50 nm and approximately 500 nm thick. The etch stop layers 504, 508 may be silicon dioxide ($SiO_2$) or any practicable etch stop material and may be between approximately 10 nm and approximately 200 nm thick. In some embodiments, etch stop layers 504, 508 may be optional.

Figure 5B:
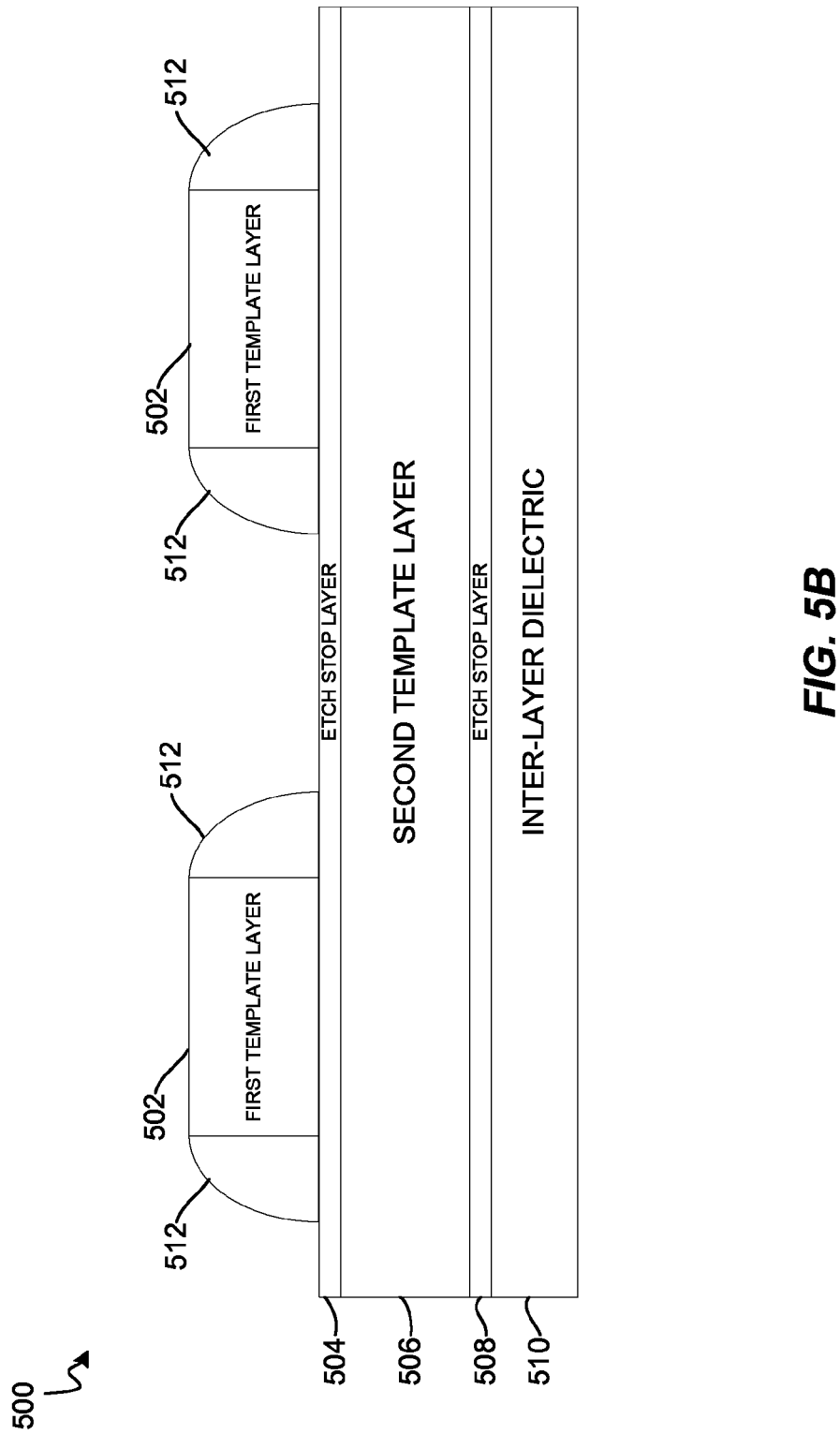
Figure 5C:
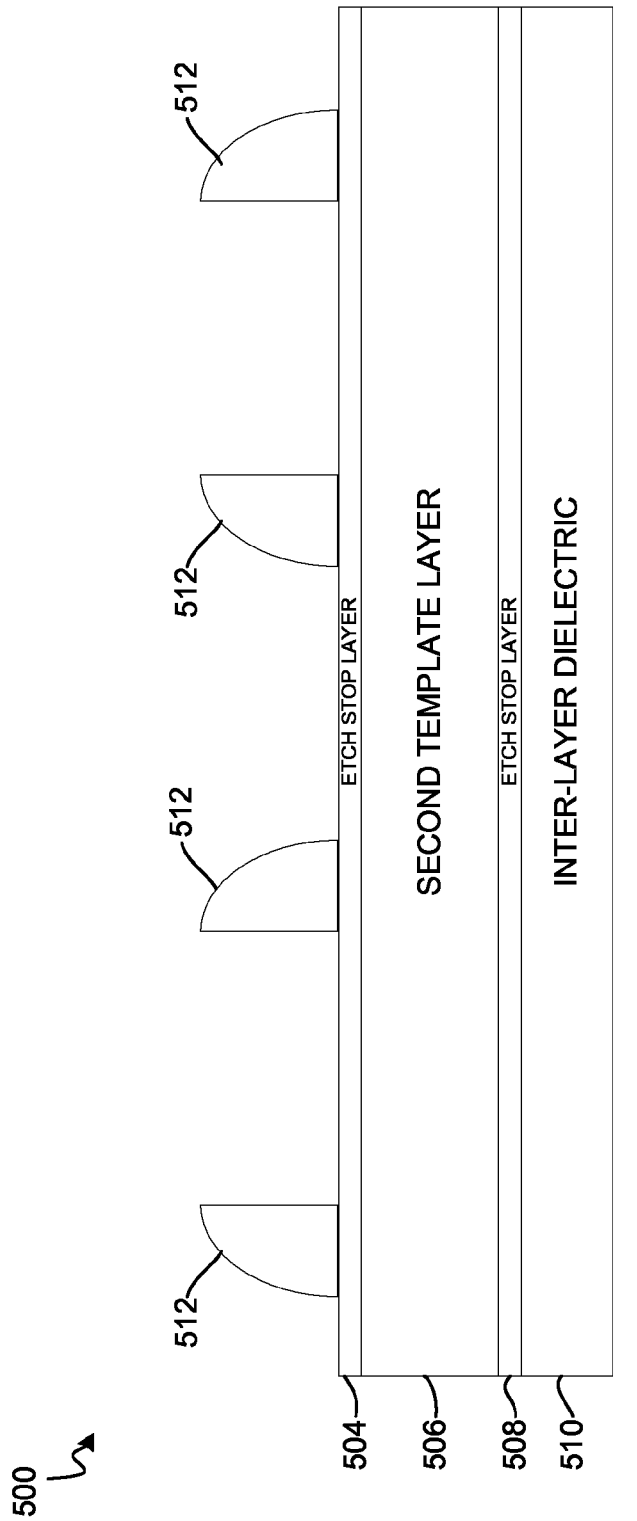

Turning to FIG. 5B, the first template layer 502 is patterned with rails/lines (or other features) using conventional lithography (e.g., 32 nm technology) having the minimum pitch commensurate with the available lithography and patterning technology. The line features shown in FIG. 5B extend into and out of the page, and are shown in cross-section. Next, by depositing a conformal liner of, for example, polysilicon and performing an isotropic etch step, a sidewall hardmask 512 is formed on the sides of the line features patterned in the first template layer 502. The resulting sidewall hardmask 512 includes sidewall spacers on either side of the first template layer 502 line features as shown in FIG. 5B. The sidewall hardmask 512 has a pitch that is smaller than the minimum pitch of the original line pattern, e.g., approximately half the pitch of the original line pattern. The sidewall spacers are separated by spaces having a width greater than one-half the minimum pitch. For example, the ratio of the width of the spaces to the width of the line features 502 may be about 3:1. Polysilicon or any practicable material may be used to form the sidewall hardmask 512. A wet etch process may then be used to remove the remaining first template layer 502 (i.e., the line features) between the sidewall hardmask 512 spacers as shown in FIG. 5C. The etch process may also be used to remove the optional etch stop layer 504 between the sidewall hardmask 512 spacers. In some embodiments, the second template layer 506 may optionally be $SiO_2$ or have a similar etch rate ratio to the first template layer 502 so that an etch stop layer 504 is not necessary.

Figure 5D:
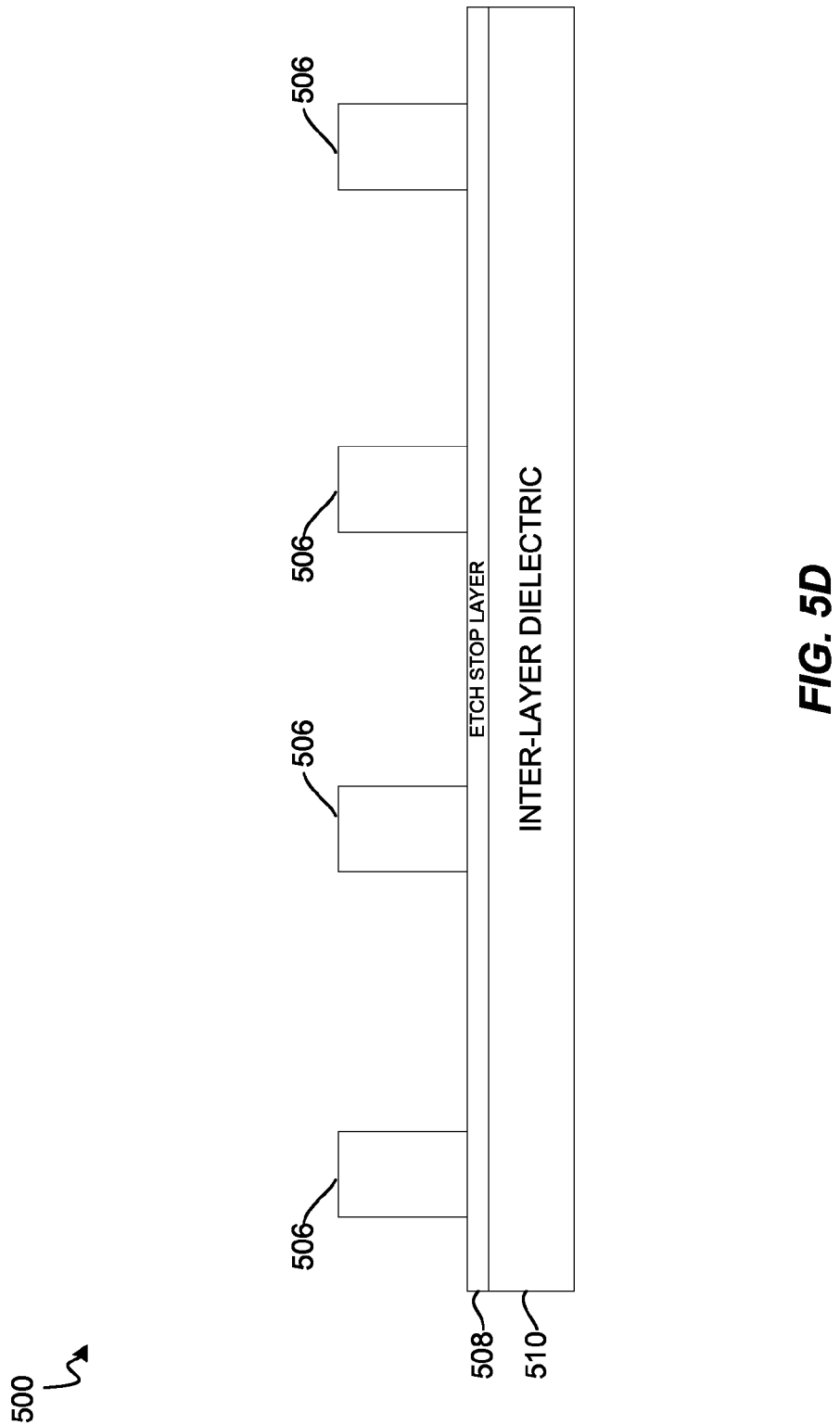
Figure 5E:
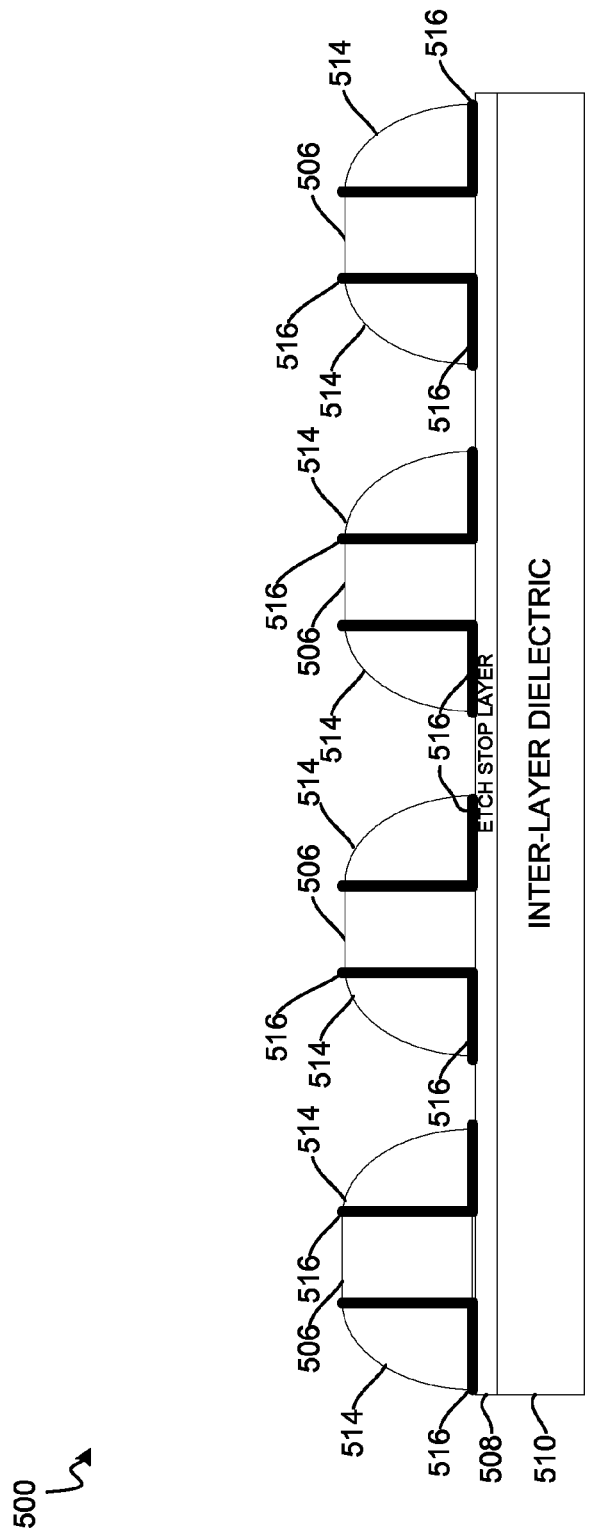

Next, the "half-pitch" sidewall hardmask 512 is used to pattern the second template layer 506 into half-pitch lines as shown in FIG. 5D. For example, a timed etch or an end point detection etch to the second optional etch stop layer 508 may be used. Turning to FIG. 5E, conductive material 514 may be conformally deposited on the line features 506 to form sidewall conductors. Optionally, an adhesion/barrier layer material 516 may be deposited before the conductive material 514. In some embodiments, TiN maybe used as the adhesion layer material 516 and W as the conductive material 514. In other embodiments, TaN maybe used as the adhesion/barrier layer material 516 and copper (Cu) as the conductive material 514. In such embodiments, the Cu lines may subsequently be coated with electroless TaN using a selective deposition process.

Figure 5F:
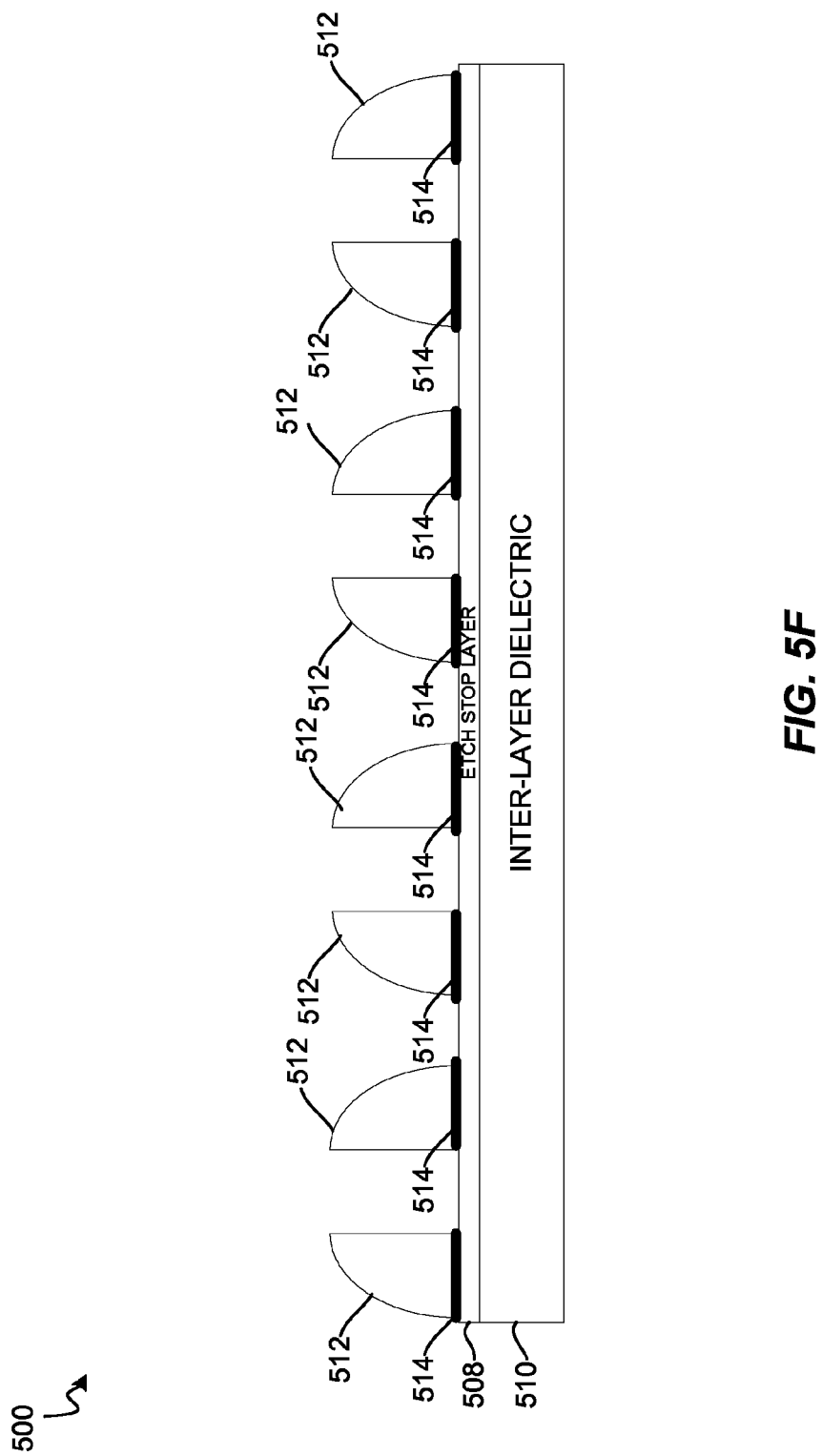

Next, a dielectric material such as $SiO_2$ may be deposited and a planarization process (e.g., chemical mechanical planarization, etch back, etc.) may be used to level the four times HP relief deposited features. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. In some embodiments, the remaining second template layer material 506 may be removed as shown in FIG. 5F and a dielectric gap fill material may then be deposited and planarized.

Figure 6B:
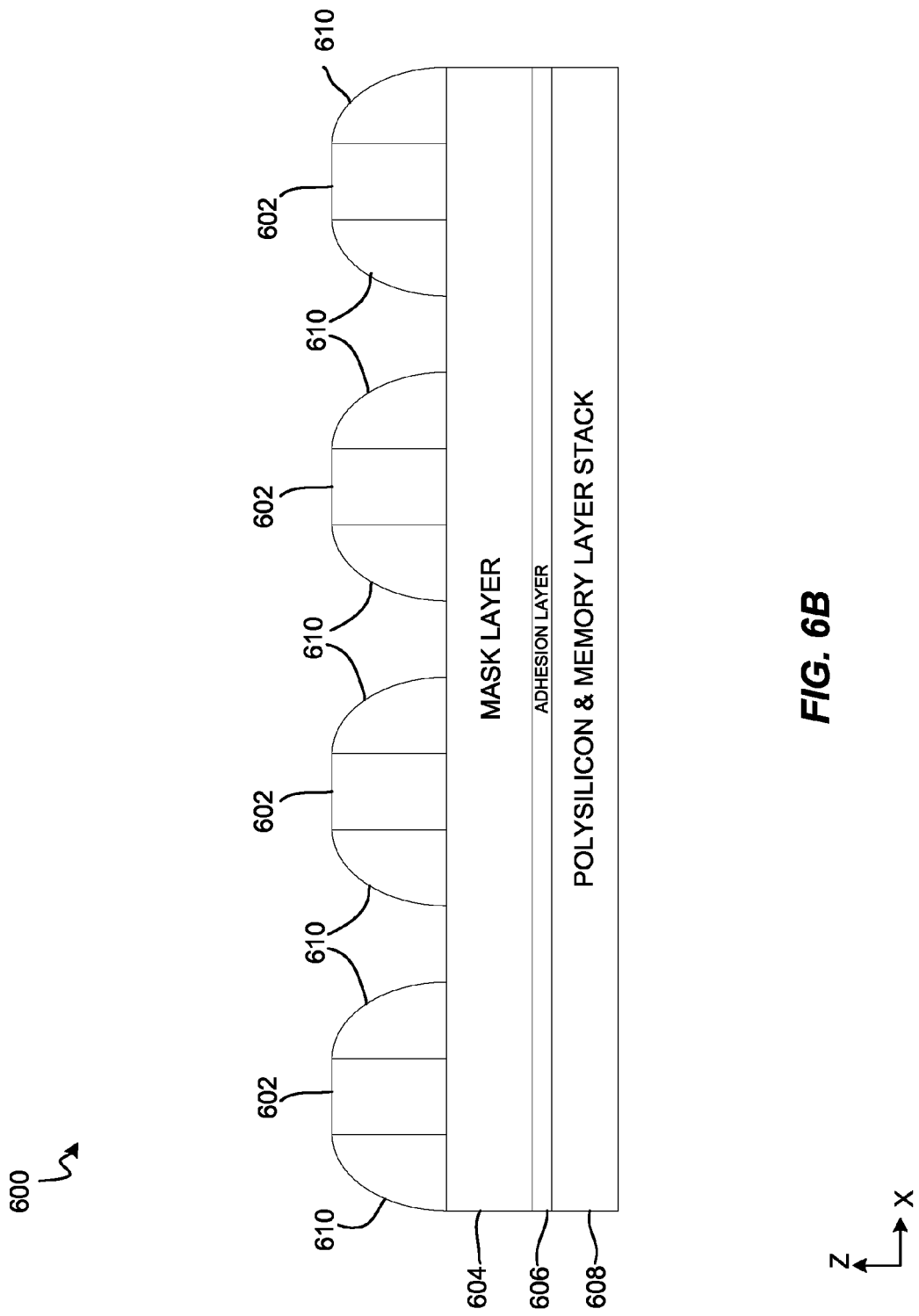

Turning now to FIGS. 6A to 6F, example methods of using a sequential sidewall patterning process to form a mask for patterning a memory cell array are described. FIG. 6A depicts the cross-section of an example stack of layers 600 that may be used to in the sidewall patterning process of the present invention. As shown, a first template layer 602 is deposited on a mask layer 604. An optional etch stop layer (not shown) may be deposited between the first template layer 602 and the mask layer 604. The mask layer 604 is formed on an optional adhesion layer 606 which is bound to an inter-layer dielectric and memory stack layer 608. The memory stack layer 608 may include any set of practicable memory materials as described above or as know in the art. Also as indicated above, other memory and/or wiring layers may be formed above and below the layer stack 600.

The first template layer 602, may be silicon nitride ($Si_3N_4$), silicon dioxide ($SiO_2$), or any practicable template material. This layer may be between approximately 50 nm and approximately 500 nm thick. Other thicknesses may be employed. The optional etch stop layer (not shown) may be silicon dioxide ($SiO_2$) or any practicable etch stop material and may be between approximately 10 nm and approximately 200 nm thick. Other thicknesses may be employed. The adhesion layer 606 may be titanium nitride (TiN), tantalum nitride (TaN), tungsten nitride (WN) or any practicable adhesion material and may be between approximately 20 to approximately 500 angstroms thick, and preferably approximately 100 angstroms thick. Other adhesion layer materials and/or thicknesses may be employed. In some embodiments, an adhesion layer 606 may be optional.

Mask layer 604 may include any suitable hardmask material such as tungsten (W) or another appropriate material, heavily doped semiconductor material, a silicide, a silicide-germanide, a germanide, or any practicable material deposited by any suitable method (e.g., chemical vapor deposition ("CVD"), physical vapor deposition ("PVD"), etc.). In at least one embodiment, mask layer 604 may be approximately 200 to approximately 2500 angstroms of tungsten thick. Other mask layer materials and/or thicknesses may be used.

Turning to FIG. 6B, the first template layer 602 is patterned with rails/lines (or other features) using conventional lithography (e.g., 32 nm technology) having the minimum pitch commensurate with the available lithography and patterning technology. The line features shown in FIG. 6B extend into and out of the page, and are shown in cross-section. In other words, with respect to the Cartesian reference frame in the lower left hand corner of FIG. 6B, the line features extend in the Y direction which is perpendicular to both the depicted X and Z directions.

Next, by depositing a conformal liner of, for example, polysilicon and performing an isotropic etch step, a sidewall hardmask 610 is formed on the sides of the line features patterned in the first template layer 602. The resulting sidewall hardmask 610 includes sidewall spacers on either side of each of the first template layer 602 line features as shown in FIG. 6B. The sidewall hardmask 610 has a pitch that is smaller than the minimum pitch of the original line pattern, e.g., approximately half the pitch of the original line pattern. The sidewall spacers are separated by spaces having a width greater than one-half the minimum pitch. For example, the ratio of the width of the spaces to the width of the line features 602 may be about 3:1. Polysilicon or any practicable material may be used to form the sidewall hardmask 610. A wet etch process may then be used to remove the remaining first template layer 602 (i.e., the line features) between the sidewall hardmask 610 spacers. The etch process may also be used to remove any optional etch stop layer between the sidewall hardmask 610 spacers.

Figure 6C:
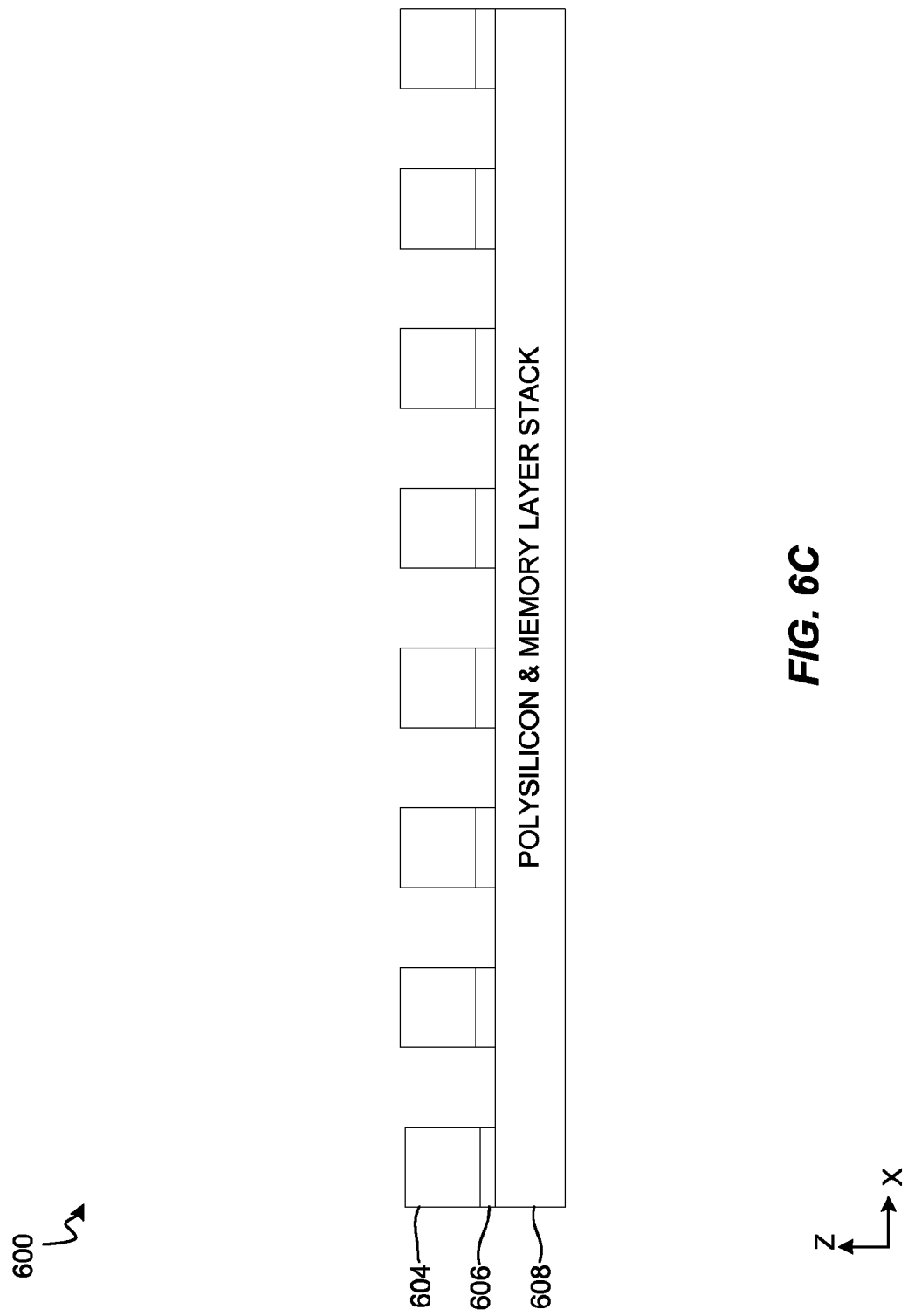

The "half-pitch" sidewall hardmask 610 may then be used to etch the mask layer 604 to form quarter pitch structures such as a rail pattern as shown in FIG. 6C. Recall that FIG. 6C is a cross-sectional view of the structure and the rail pattern extends in the Y direction which is into and out of the drawing page. A dielectric gap fill material (e.g., SiO$_2$) may then be deposited and a planarization process may be used to level the two times HP relief patterned features. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 6D:
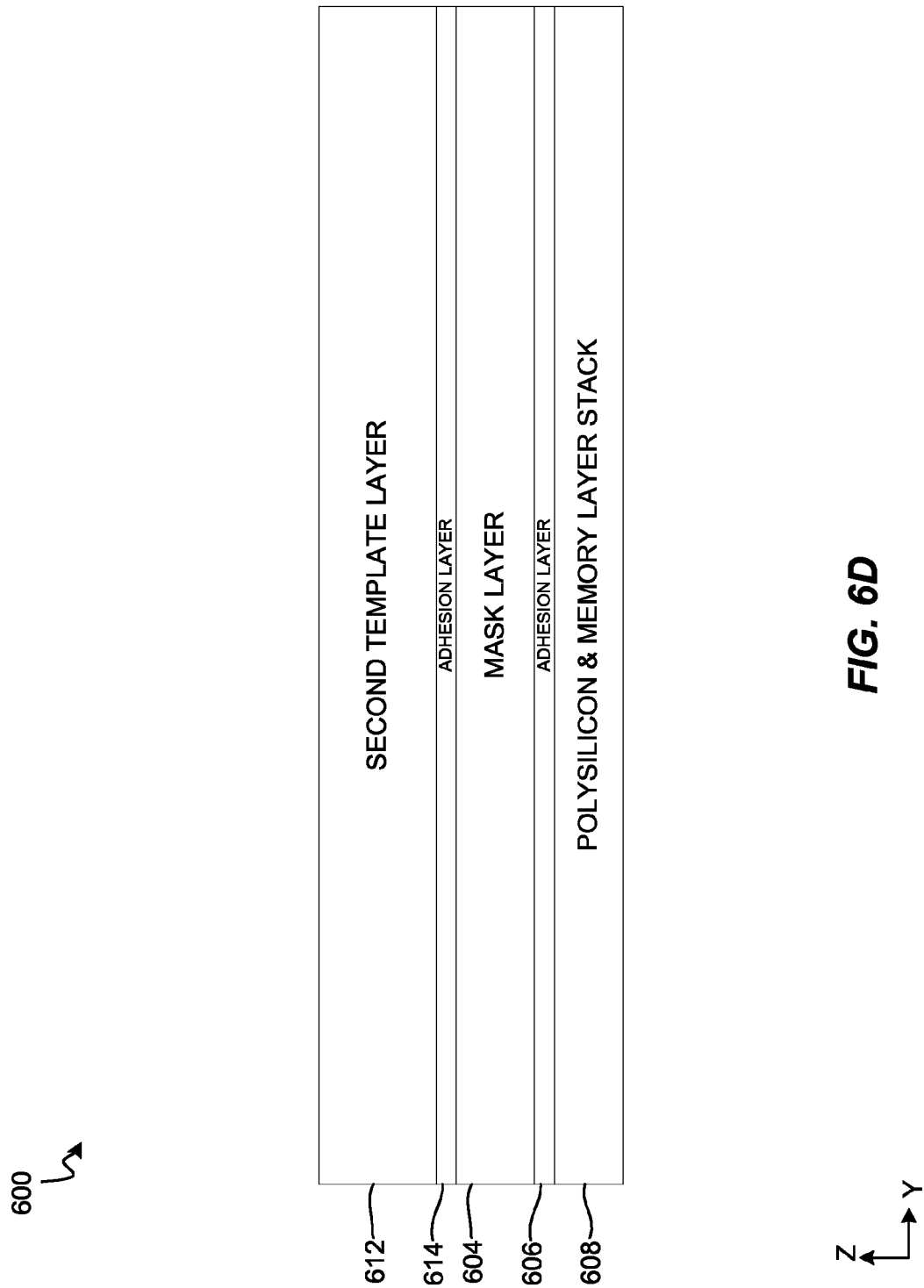

Turning now to FIG. 6D, a second template layer 612 (e.g., Si$_3$N$_4$) is then formed on the planarized mask layer 604. Optionally, an adhesion layer 614 may be deposited between the second template layer 612 and the mask layer 604. Note that FIG. 6D depicts a cross-sectional view of the structure 600 rotated ninety degrees relative to the cross-sectional view of FIG. 6C. In other words, the line features patterned into the mask layer 604 extend across the width of the page instead of into and out of the page. Also note that the Cartesian reference frame in the lower left corner has been rotated to reflect this different view.

Figure 6E:
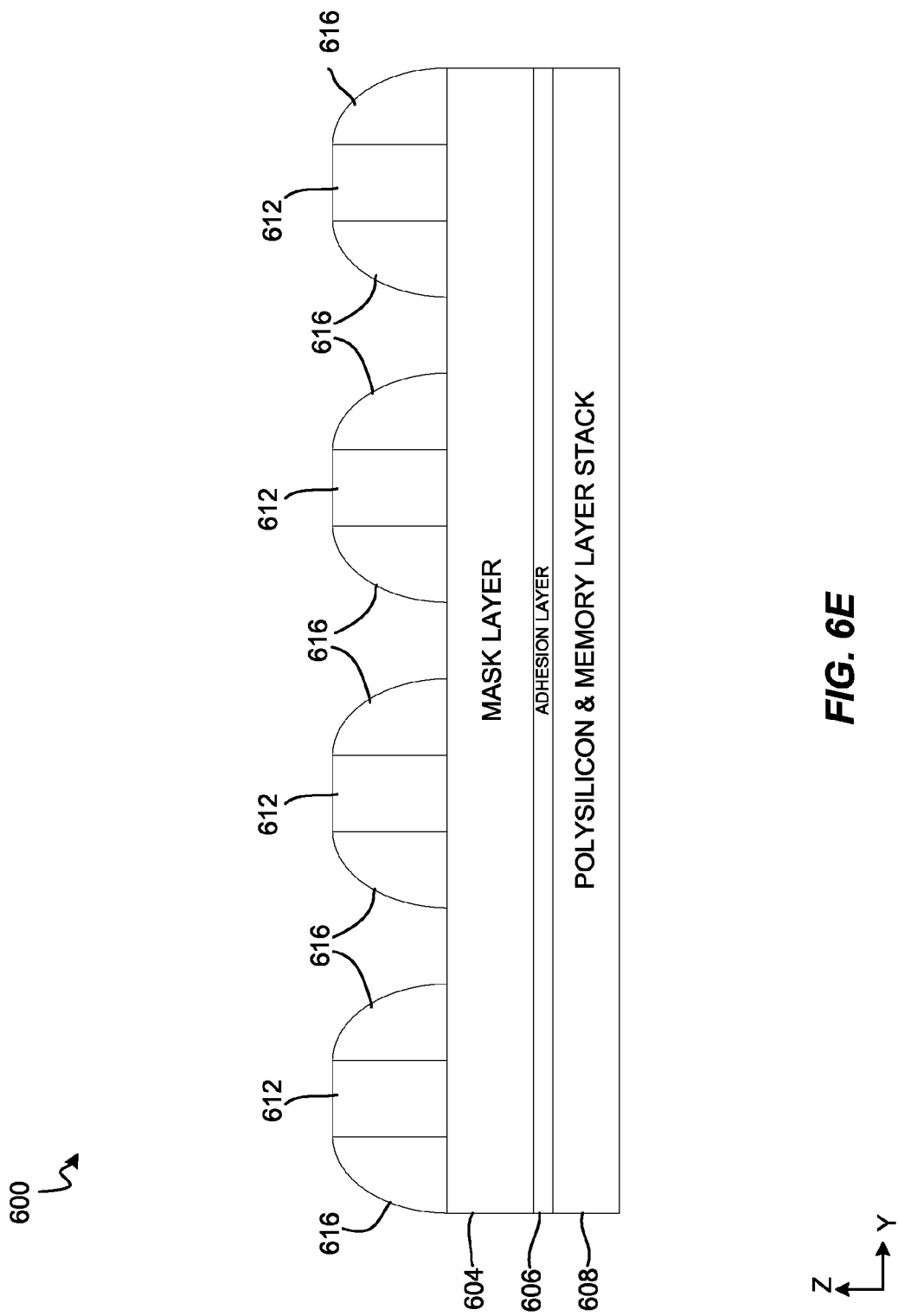

Next, the patterning process described above with respect to the first template layer 604 is repeated on the second template layer 612 but rotated approximately ninety degrees. In other words, using the same process described above with respect to the first template layer 604, a second "half-pitch" sidewall hardmask 616 is formed as shown in FIG. 6E with line features running approximately perpendicular to the direction of the first "half-pitch" sidewall hardmask 610 (which is no longer part of the structure). Thus, a line pattern that extends in the X direction is formed in the second template layer 612 and a second "half-pitch" sidewall hardmask 616 is formed.

Figure 6F:
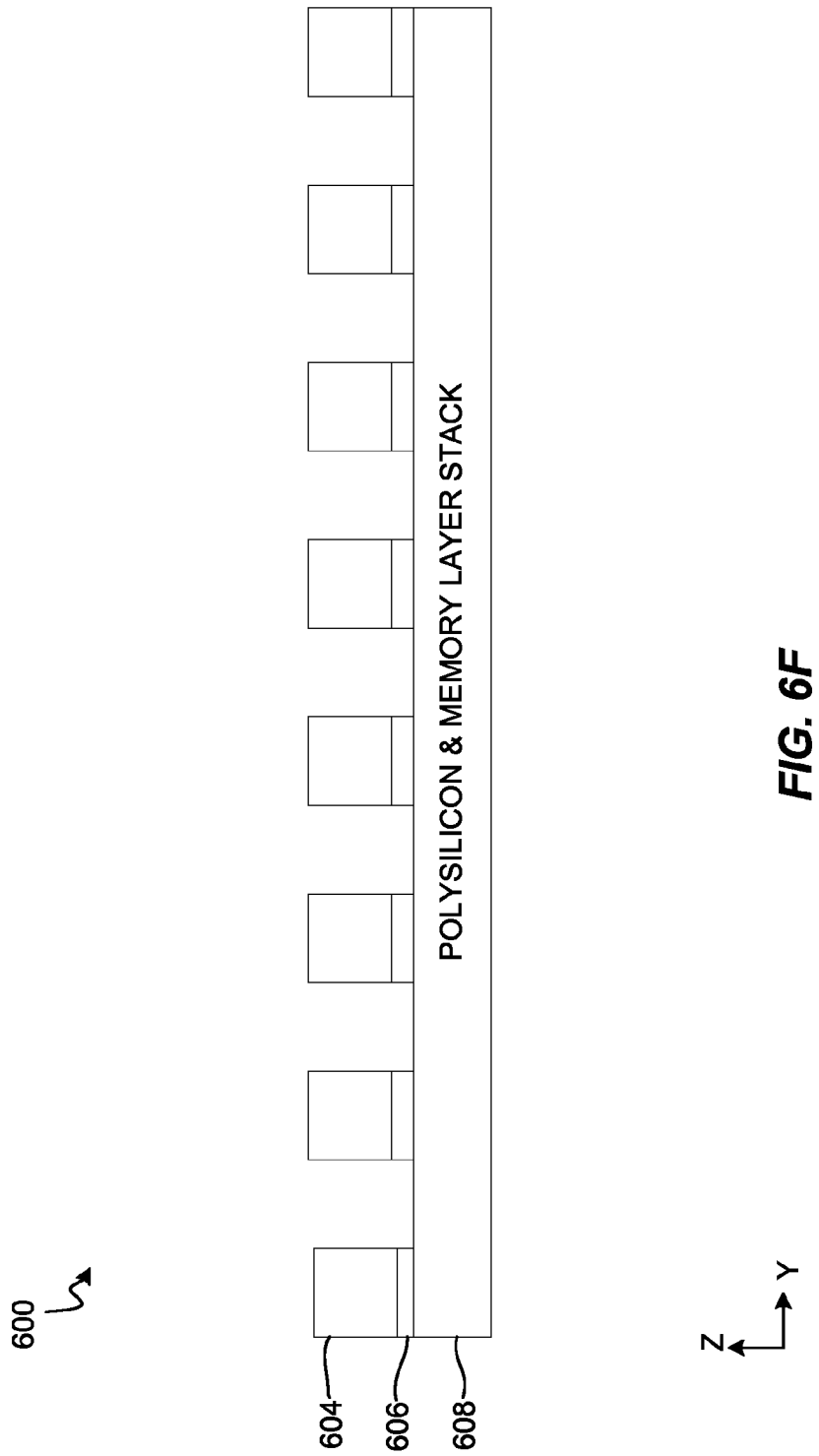

Next, the second "half-pitch" sidewall hardmask 616 is used to pattern the mask layer 604 into an array of half-pitch rectangular prism-shaped pillar features as shown in FIG. 6F. A perspective view of the resulting structure 600 is shown in FIG. 7. The patterned mask layer 604 may then be used to form an array of half-pitch rectangular prism-shaped memory cell pillars by etching the underlying ILD/memory stack 608 not covered by the patterned mask layer 604.

Next, a dielectric material such as SiO$_2$ may be deposited and a planarization process (e.g., chemical mechanical planarization, etch back, etc.) may be used to level the memory cell array. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. In some embodiments, the mask layer 604 may be tungsten, as indicated above, and a layer of tungsten may be intentionally left on the top of the memory cell pillars.

In alternative embodiments, a double sequential sidewall patterning process as described above with respect to FIGS. 4A through 4F may be used in two dimensions to create a pillar array. The resulting mask layer is patterned into a quarter-pitch array which can be used to form an array of quarter-pitch rectangular prism-shaped memory cell pillars. In other words, the present invention may also be used to form a memory array with "4×" half pitch relief.

The present invention also provides a reduced cost layout pattern for memory lines leading out of and into memory array blocks. The inventive memory line layout accommodates the small pitch that may be achieved in the memory array blocks using a sequential sidewall-defined process to construct the memory arrays. The sidewall-defined process is described in detail above.

According to further aspects of the present invention, X and Y memory lines (e.g., bit and word lines) are interleaved in pairs extending from opposite sides of the memory array blocks with cut shapes on alternating pairs. This arrangement allows the memory line pairs to be spaced apart from other pairs outside of the memory array block and at the same time allows the lines to be staggered so that cut shapes and via (or zia) contact pads can be made larger (e.g., with lest strict tolerances). Thus, the present invention allows the cut shapes disposed between adjacent pairs of memory lines and the contact pads to be, for example, four times the half-pitch dimension of the memory lines.

Further, the present invention facilitates manufacturing cost reduction of submicron three dimensional memory arrays. In particular, the present invention provides methods that avoid having to use extreme-ultraviolet lithography (EUVL) or e-beam direct write lithography methods (e.g., both of which are relatively expensive) to form memory lines with a half-pitch dimension below approximately 32 nm. Thus, using the methods of the present invention, cost efficient 64 nm lithography tools (e.g., lithography tools for forming memory lines and tools for forming cut masks and zias with a nominal minimum feature size of 64 nm) can be used to achieve effective memory line patterning down to a 16 nm half pitch dimension, for example, with array line groups of four and four rows of zias. In some embodiments, 32 nm lithography can be used to achieve effective memory line patterning down to an 8 nm half pitch dimension and 64 nm lithography tools can be used to form cut masks and zias with array line groups of eight and eight rows of zias, for example. Note that in terms of current technology, this improvement represents an extension of 32 nm lithography of five generations: from 32 nm, to 22 nm, to 16 nm, to 11 nm, to 8 nm for array lines and represents an extension of 64 nm lithography of six generations for cut masks and zias.

In other embodiments of the invention, EUV lithography, for example, can be used to achieve effective memory line patterning down to 6 nm half pitch dimension and 60 nm lithography can be used to form cut masks and zias with array line groups of ten and ten rows of zias. However, it will be understood that the present invention may be used to extend other and future technologies as well.

More generally, the present invention facilitates the use of memory lines that have a half pitch dimension smaller than the nominal minimum feature size capability of a lithography tool used to form the memory array lines. According to the present invention, the zia contact areas and cut shapes can have a dimension larger than the nominal minimum feature size capability of the lithography tool used to form the array lines. Zia definition is more difficult than uniform line and space definition. Also, pitch doubling techniques used to further reduce array line pitch may be avoided for the zia processing. As the array line pitch is reduced by using pitch doubling techniques and more expensive process and lithography techniques, the use of simpler and less expensive lithography techniques for zias is advantageous.

Figure 8:
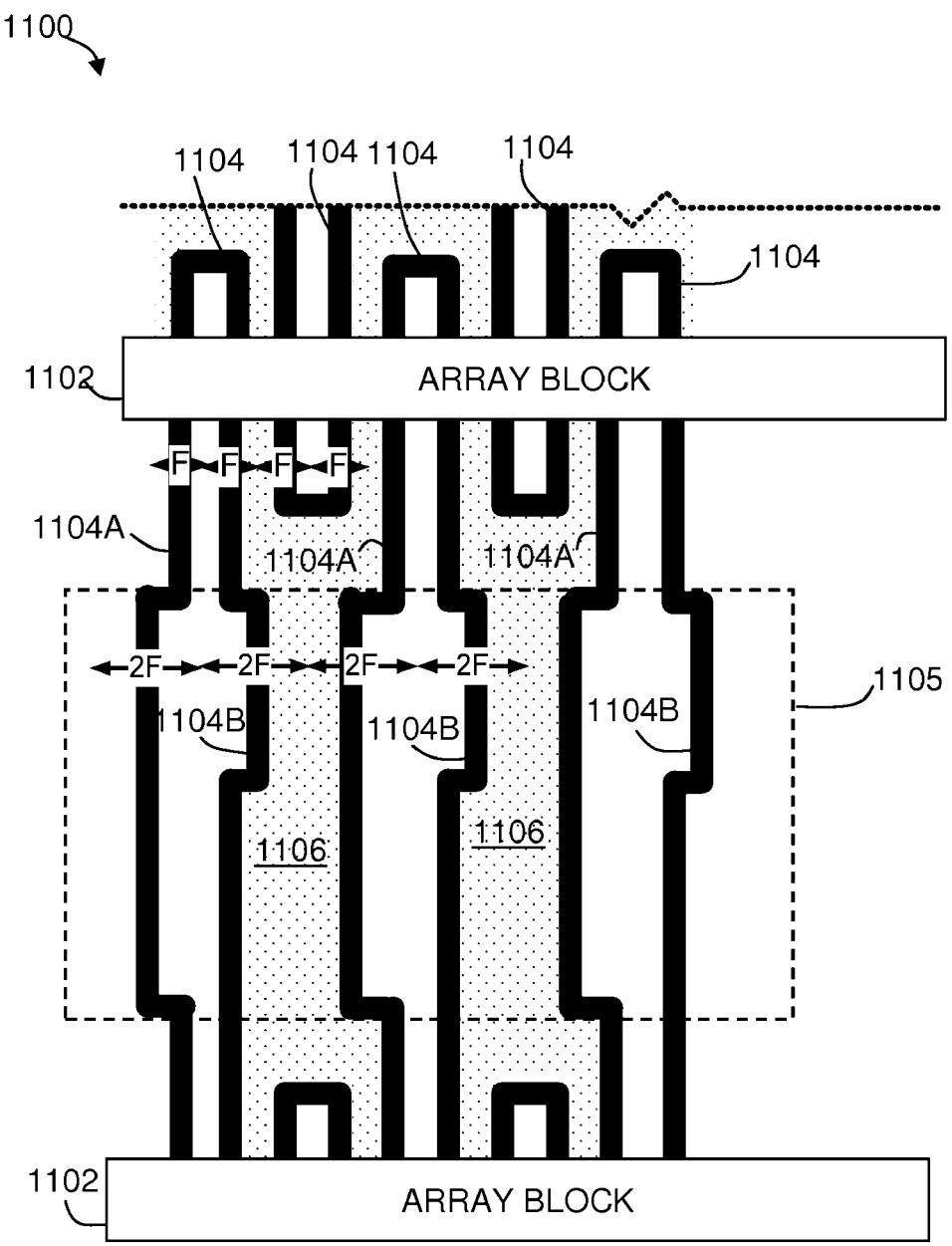
FIG. 8 is a schematic drawing of an example arrangement of a memory line layout according to some embodiments of the present invention.

Turning to FIG. 8, a layout 1100 of a three-dimensional memory array is shown. The memory array 1100 includes one or more array blocks 1102 that include an array of memory cells. Memory array lines 1104 extend in pairs in alternating directions from two or more sides of the array blocks 1102. A multiple line pitch relaxing layout 1100 is achieved by a novel array line layout. The pitch of cut mask shapes (discussed below) is quartered by forming pairs of array lines 1104 alternating between extending into a zia contact area 1105 versus terminating at the array block 1102 edge. The pitch of zia shapes is also quartered because half the array lines are terminated and zias may be arranged in two rows as will be shown in FIG. 9, for example. The tight space between the members of the pairs of array lines 1104 extending to the zia contact area 1105 is relaxed by adjusting the width and space of the template shape 1106 in the zia contact area 1105 to provide more than twice the area to place a zia (not shown but see FIG. 9) and four times as large a pitch of zia shapes compared to the array line pitch. Although pairs of lines 1104 extending from the array block 1102 have no immediate pitch relaxation at the edge of the array 1102, a pitch doubling technique, for example a sidewall definition process using a template layer, may be used to extend pairs of lines 104 at the tight half pitch.

Figure 9:
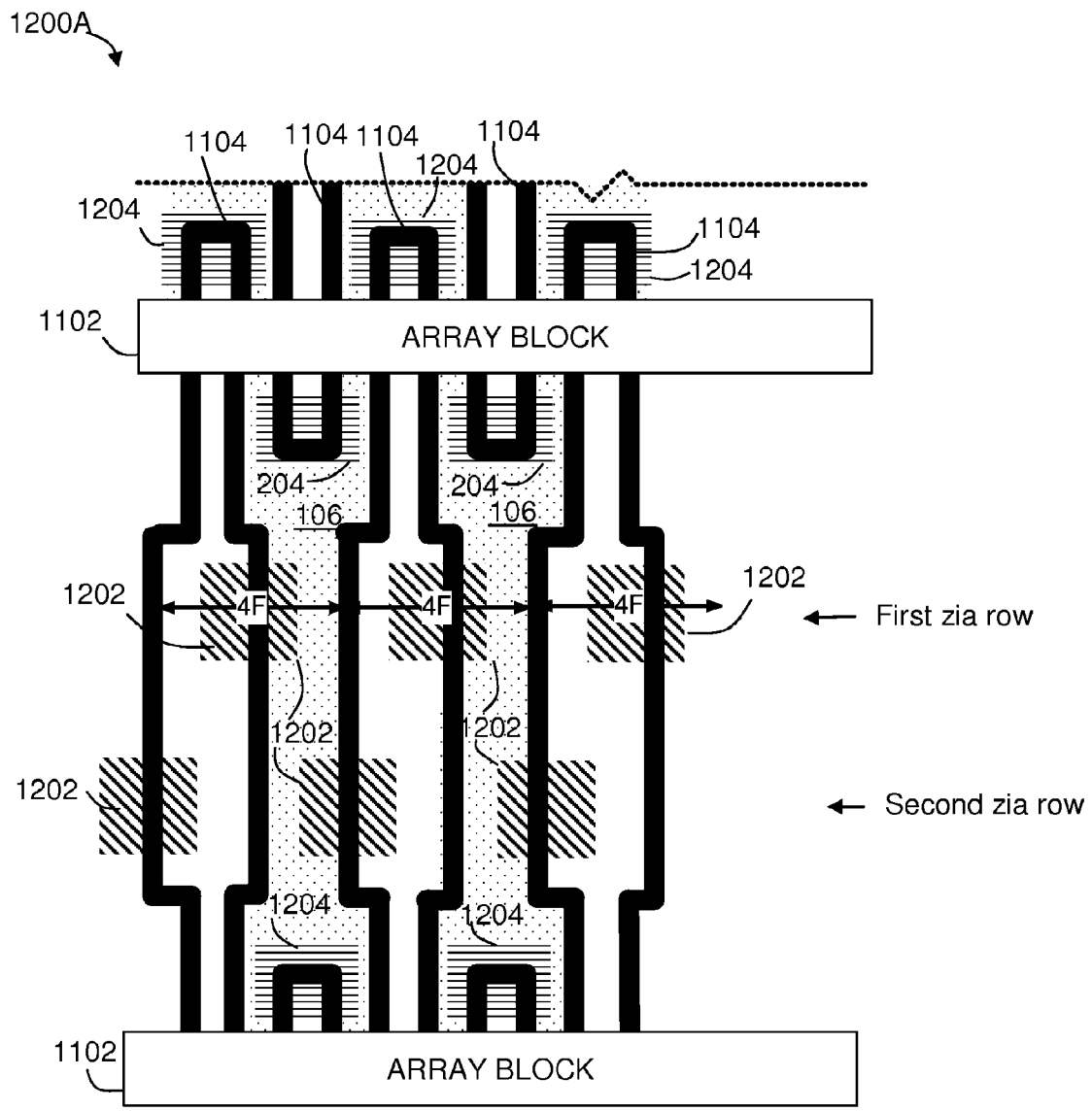
FIG. 9 is a schematic drawing of an example arrangement of a memory line layout including cut shapes and contact pads according to some embodiments of the present invention.

Turning to FIG. 9 for a moment, a feature of the layout of the present invention is that the template shape 1106 between the pairs of array lines 1104 extends out of the array block 1102 beyond the location of the cut mask shape 1204 (FIG. 9) or end of the terminated pair. The cut mask 1204 may terminate the adjacent pair and separate the adjacent pair into individual electrical nodes. This separation is used in any case when sidewall defined lines are used in the array and does not add process complexity for the multiple line pitch relaxing technique. The cut mask 1204 may have four times the pitch compared to the array lines 1104. The group of array lines extending into the contact area may be separated at the far side of the array 1102 by a cut mask shape 1204. The array lines 1104 that extend into the contact area may extend into a second array block 1102 and may be shared between the two arrays. Cut masks 1204 at the far side of both arrays 1102 are used to separate the pair 1104 into unique electrical nodes.

Past the cut mask 1204 in the contact area, the width of template shapes 1106 is increased significantly because half the array lines have been cut. In FIG. 8, "2F" indicates the increased width for example. The spacing between template shapes 1106 may also be increased to a width greater than the feature size of the lithography. The array lines 1104 which are formed at the edge of the template shape 1106 therefore have a pitch greater than the lithography feature size as indicated in FIG. 8 by the "2F" dimension where "F" represents the pitch of the array lines 1104 as shown in FIG. 8. The F dimension also represents the half pitch of lithography tools used for forming the template shape 1106. Since zias 1202 for each of the two lines 1104 of the pair are staggered, the zia pitch is 4F as shown in FIG. 9. First and second zia rows are indicated in FIG. 9.

In some embodiments, the memory lines may be approximately 32 nm down to approximately 4 nm wide and spaced apart a distance approximately 32 nm down to approximately 4 nm at the point the lines 1104 exit the array blocks 1102. The pairs of lines 1104 are formed on either side of a template mask 1106. To achieve approximately equal line and space for the array lines, the template shape 1106 may be reduced in size during the photolithography and etching processes so that the template width is less than the template space in the array areas. The template shape 1106 may be reduced in size down from 32 nm to approximately 4 nm in the tight pitch regions. As shown in FIG. 8, the array line pairs 1104 can extend into adjacent array blocks 1102, as may be desirable in a three-dimensional matrix memory chip. The line pairs 1104 are disconnected from each other at the far edge of the array block into separate lines using a cut mask which is described below with respect to FIG. 9. In some embodiments, the template mask 1106 is two times (2×) the half pitch (HP) relative to the fabricated memory lines. In some alternative embodiments, where double sidewall patterning is used, the template mask may be four times (4×) HP.

In operation, array lines are electrically driven for write operations and sensed for read operations by connection to a data bus (not shown) controlled by array line driver circuitry under the contact region 1105. Adjacent array lines 1104 are connected to different data bus lines each of which can be at either an active or inactive state by means of read-write control logic connected to the data bus. Because the lines 1104 may be so close together according to the present invention, if adjacent lines are active at the same time, there may be electrical crosstalk that interferes with operation of the memory array 1102. Thus, in a further aspect of the invention, at any given time, only one group of alternating lines 1104A or 1104B may be active while the other lines are inactive. In other words, when lines 1104A carry a signal, lines 1104B are not used and when lines 1104B carry a signal, lines 1104A are not used. This insures that no two adjacent lines 1104A and 1104B are active at the same time and provides sufficient spacing between lines to avoid crosstalk or other interference effects. In some embodiments, only every third, or fourth, or fifth array line may be active at a given time. In other embodiments, any pattern of lines may be used that avoids interference between lines.

Turning again to FIG. 9, the locations of zia contact pads 1202 and the cut mask 1204 areas are indicated with crosshatching and horizontal lines respectively. Zias provide means to connect memory lines (or more generally conductors) on multiple different memory layers to array line drivers and other support circuitry. Whereas a conventional via connects two different layers of a circuit, a zia connects multiple layers. Note that as shown in FIG. 9, each memory line 1104 passes through one of the staggered zia contact pads 1202 to connect two adjacent array blocks 1102. By staggering the zia contact pads 1202 in an alternating or checker board pattern and routing the memory lines 1104 as shown, there is more room for the zia contact pads 1202 even thought the memory line pitch is relatively small.

The cut mask 1204, as indicated above, is used to separate the pairs of memory lines 1104 formed using the template mask 1106 into two separate conductors. The cut mask 1204 indicates a portion of the memory lines 1104 that will be removed. In the example embodiment shown, the cut mask 1204 is 4× HP and arranged at a pitch as large as four times the pitch of the array lines. In other words, the layout of the present invention allows the cut mask 1204 areas to be four times larger than the distance between the memory lines. This means that the cut mask 1204 can be manufactured with substantially lower precision requirements (e.g., with looser tolerances) and therefore less expensively, than would otherwise be possible without the present invention. Likewise, by staggering the zia contact pads 1202, the zia contact pads 1202 can be made larger to allow a larger margin (e.g., more tolerance) for misalignment between the zias and the memory lines, which also reduces costs associated with having to use much more precise and expensive manufacturing tools.

Figure 10:
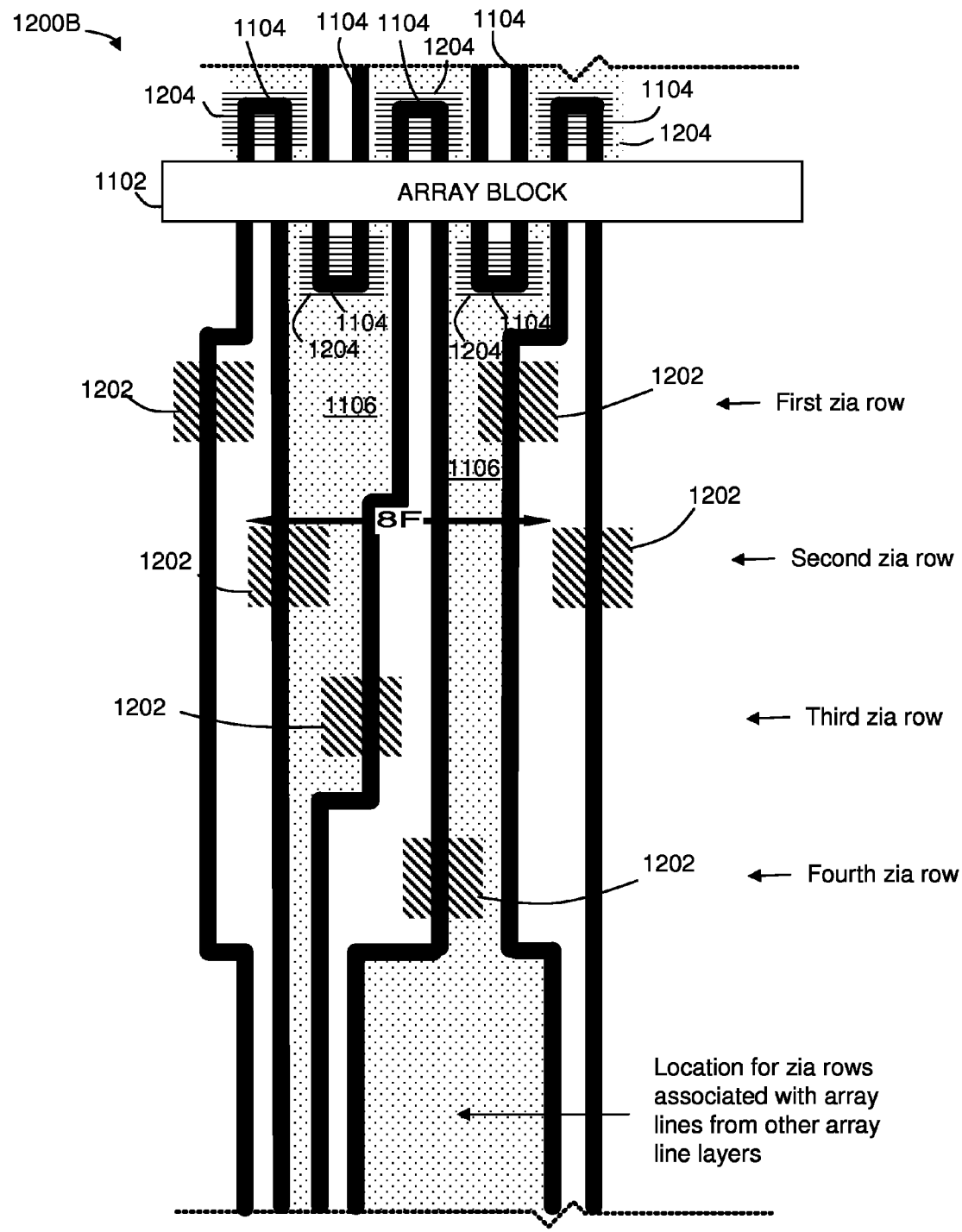
FIG. 10 is a schematic drawing of an example alternative arrangement of a memory line layout according to some embodiments of the present invention.

Turning to FIG. 10, an alternative example embodiment of the memory line layout 1200B of the present invention is shown. In the embodiment depicted in FIG. 10, the zia contact pads 1202 are staggered in four rows and may be at a pitch eight times larger than the array pitch as illustrated by the symbol 8F. The zias are arranged in a graduated or stair step pattern. In yet other embodiments, any practicable combination of the alternating pattern of FIG. 9 and the graduated pattern of FIG. 10 may be employed to achieve the desired zia pitch. In still yet other embodiments, any arrangement where the desired 4× HP or greater spacing is achieved may be employed.

As compared to the embodiment of FIG. 9, further relaxation of zia pitch may be achieved in the embodiment of FIG. 10. Half of the pairs of array lines 1104 that extend into the contact region extend at the substantially unchanged spacing of the array lines 1104 past the first two rows of zias 1202 and are contacted in a third and fourth row of zias 1202. The zias 1202 are staggered in four rows and have a pitch of 8F. The location of zias 1202 may be staggered in more than four rows if desired to increase zia pitch further.

Figure 11:
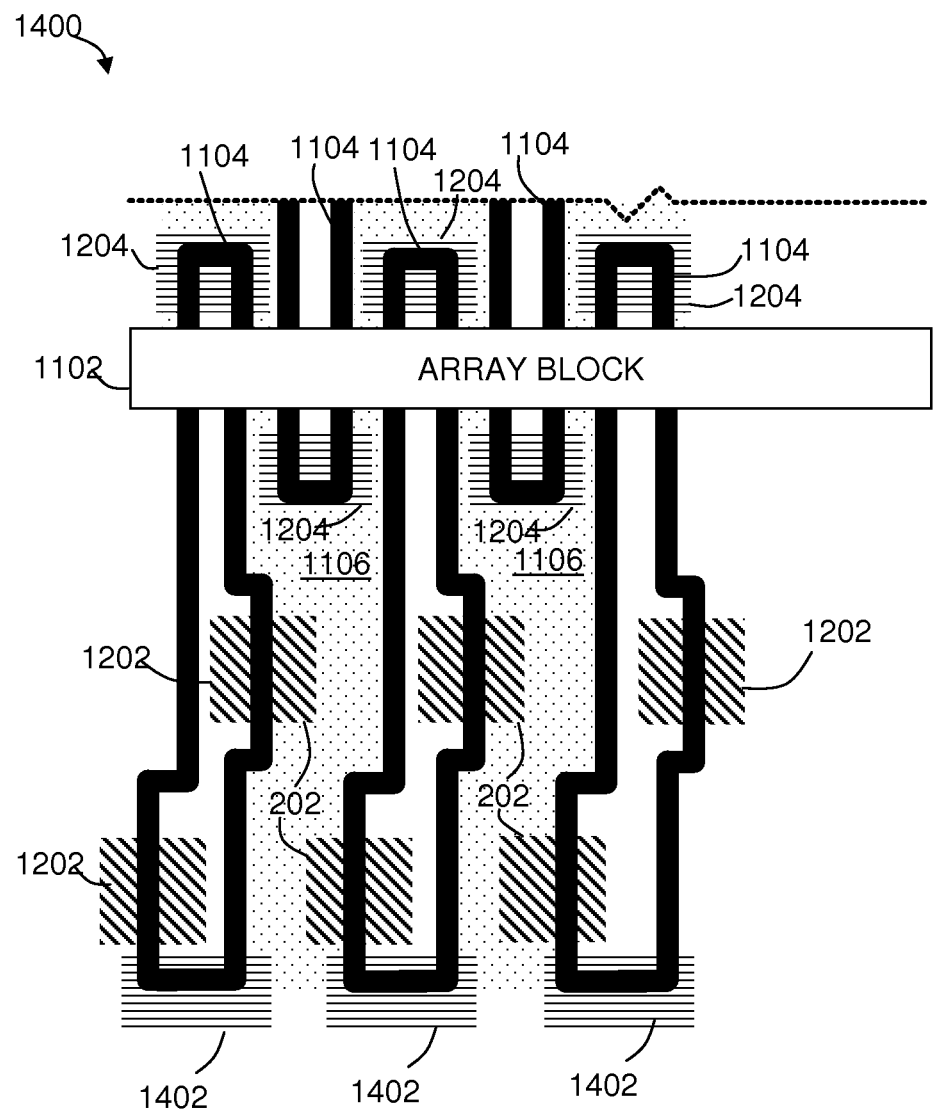
FIG. 11 is a schematic drawing of an example additional alternative arrangement of a memory line layout according to some embodiments of the present invention.

FIG. 11 depicts additional cut shapes 1402 that can be used with the cut mask 1204. These cut shapes maybe larger than or equal to the 4× HP size of the other shapes in the cut mask 1204. These larger cut shapes 1402 may be used for fill shapes, or to terminate the memory lines 1104 that extend beyond the last memory array block 1102.

FIGS. 12A to 12D are schematic drawings of example arrangements of memory lines of different wiring layers intersecting at via or zia contact pads 1202. The contact pads are represented by the diagonal cross-hatched area. The vertical cross-hatched area represents a top conductive layer in which line 1104 is formed. The solid black area depicts a memory line 1502 formed in a next lower layer. The two lines 1104, 1502 can overlap each other to some degree however, there is not complete overlap due to the use of different shapes. Formation of both the lines may be done using a sidewall defined process, for example, that uses an $SiO_2$ template layer, a polysilicon sidewall hard mask, a TiN adhesion layer, and a tungsten (W) wiring layer.

Four example intersecting line pairs are shown in FIGS. 12A to 12D. In FIG. 12A, a straight line 1104 is shown intersecting a box or "C" shaped line 1502. In FIG. 12B, two stepped lines 1104, 1502 are shown intersecting and in FIG. 12C, two straight crossed lines 1104, 1502 are shown intersecting. FIG. 12D depicts a straight line 1104 intersecting a serpentine shaped line 1502. The arrangement shown in FIG. 12D may result in the maximum contact area between the intersecting lines. Other shapes and/or combinations are possible. The present invention may use any combination of shaped intersecting lines that is practicable.

Figure 13:
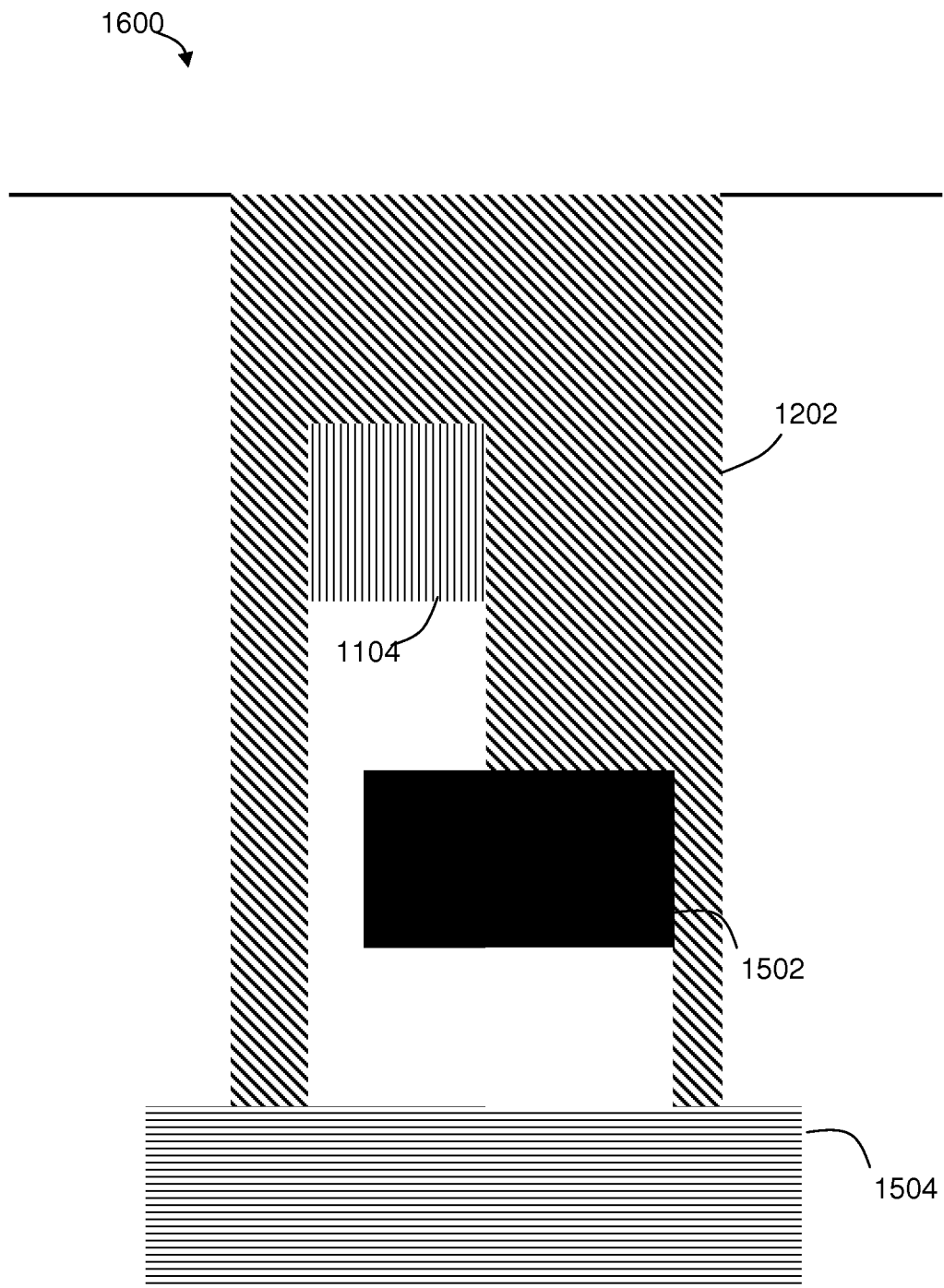
FIG. 13 is a side cross-sectional view of a contact pad/via with intersecting wiring layers according to some embodiments of the present invention.

Turning to FIG. 13, a side cross-sectional view of a zia 1202 and two intersecting conductive lines 1104, 1502 are shown. The zia 1202 contacts the conductive lines 1104, 1502 to form the electrical connection between the two lines 1104, 1502. When the zia is formed, etching is controlled so that the zia is borderless to the lines 1104, 1502. No border of the array lines beyond the zia is required because the etch of a feature or hole in an insulating material, such as $SiO_2$, into which the zia material (e.g., such as tungsten) is filled, is controlled to reach down to only desired conductors such as array line 1502 or a control node 1504. Control node 1504, being the lowest conductor contacted by the zia, may have a border to the zia, i.e., be formed larger than the zia 1202. As mentioned above, the lines may be formed using a sequential sidewall defined process, for example, that uses an $SiO_2$ template layer, a polysilicon sidewall hard mask, a TiN adhesion layer, and a W wiring layer.

Figure 14:
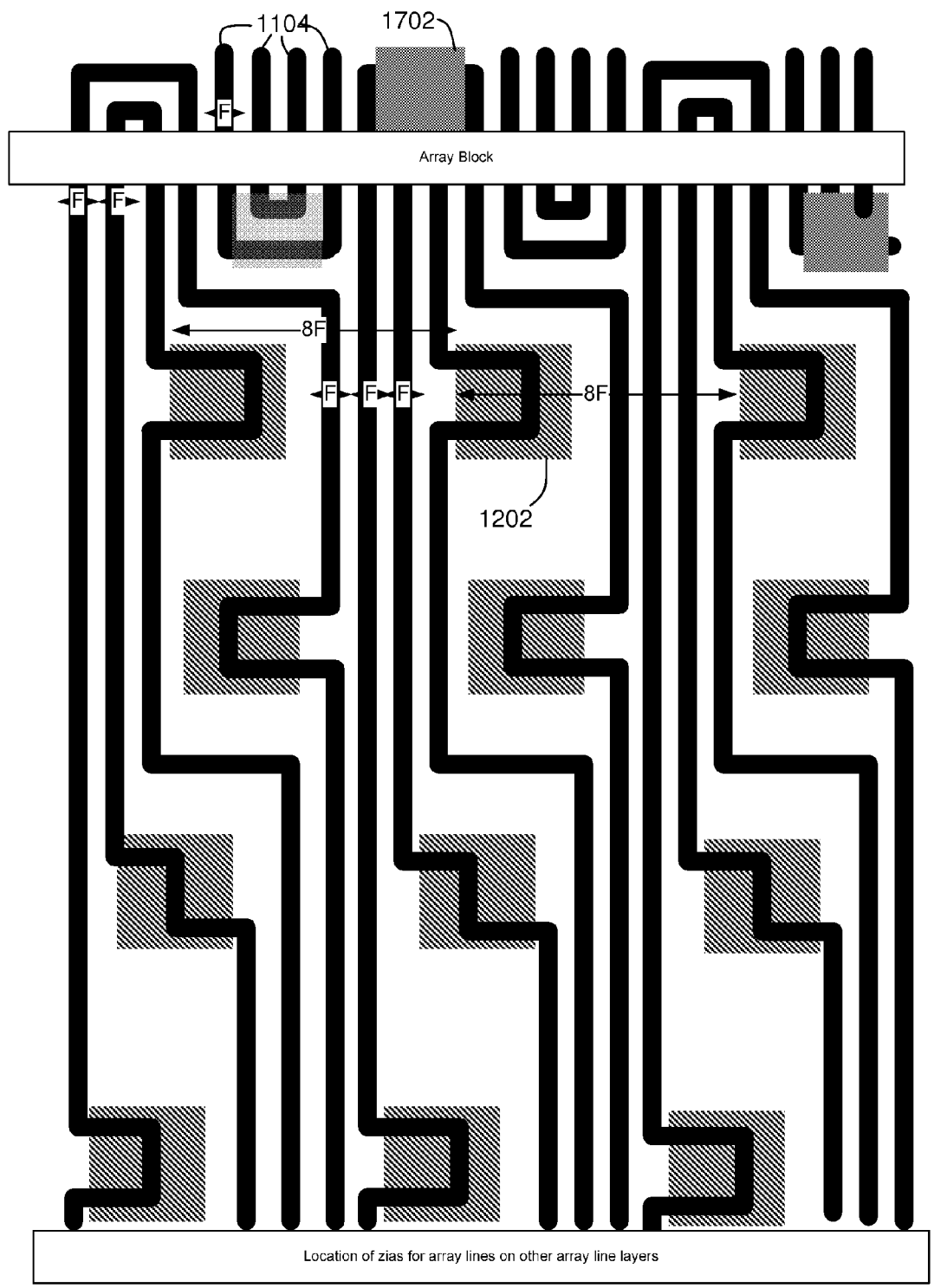
FIG. 14 is a schematic drawing of an example arrangement of a memory line layout including cut shapes and contact pads according to some embodiments of the present invention.

In another embodiment, pitch relaxation is achieved for the array lines by terminating groups of four memory lines 1104 by a cut mask 1702 as shown in FIG. 14. Grouping by four lines increases the pitch of the cut mask 1702 which allows the use of less expensive lithography tools for the cut mask 1702. The zias 1202 are disposed in four rows and have a pitch of 8F as shown. The location of zias 1202 may be disposed in more than four rows if desired to increase zia pitch further. In some embodiments, groups of three or more than four lines can also be used. In other embodiments, (1) the grouping by four or more array lines, (2) staggering zias in more rows, and (3) extending every fourth group of array line shapes without increased spacing beyond some zia rows, can all be combined.

In some embodiments, both bit lines and word lines which are substantially perpendicular sets of array lines may use the pitch and area relaxation of the present invention. Bit lines and array lines may be formed along different edges of the array blocks. Array lines formed in accordance with the present invention may be shared by two layers of 3D memory cells. In some embodiments array lines from additional 3D memory cell layers, for example those used as bit lines, may have additional zia rows beyond those zia rows shown in FIGS. 9, 10, 11, and 14. Further, array lines on one layer may pass by and not electrically contact zias associated with array lines on a second layer. Such non-contacted array lines may preferably pass by zias at a small feature size substantially the same as the array HP and may use the embodiment of FIG. 10 and zias with a pitch substantially greater than the pitch of the cut mask shape. In other embodiments, for example when the array lines are used as a word line, the zia may contact array lines on multiple layers as shown in FIG. 13.

In some embodiments, the present invention provides a method for laying out memory lines. The method includes forming a plurality of memory lines extending from one or more memory array blocks wherein the memory lines have a half pitch dimension smaller than the nominal minimum feature size capability of a lithography tool used in forming the memory lines and forming a plurality of zia contact areas having a dimension larger than the nominal minimum feature size capability of the lithography tool. The memory lines are arranged in a pattern adapted to allow a single memory line to intersect a single zia contact area and to provide area between other memory lines for other zia contact areas.

In other embodiments, the present invention provides a three-dimensional memory. The memory includes a plurality of memory layers coupled together by a plurality of zias, each zia including a zia contact area on at least one memory layer. Each memory layer includes one or more memory array blocks coupled to memory lines. The memory lines extend from the memory array blocks. The memory lines have a half pitch dimension smaller than the nominal minimum feature size capability of a lithography tool used in forming the memory lines. The zia contact areas have a dimension larger than the nominal minimum feature size capability of the lithography tool. The memory lines are arranged in a pattern adapted to allow a single memory line to intersect a single zia contact area and to provide area between other memory lines for other zia contact areas.

In yet other embodiments, the present invention provides a memory layer for a three-dimensional memory. The memory layer includes one or more memory array blocks; a plurality of memory lines coupled to the memory array blocks; and a plurality of zia contact areas for coupling the memory layer to other memory layers in a three-dimensional memory. The memory lines extend from the memory array blocks. The memory lines have a half pitch dimension smaller than the nominal minimum feature size capability of a lithography tool used in forming the memory lines. The zia contact areas have a dimension larger than the nominal minimum feature size capability of the lithography tool. The memory lines are arranged in a pattern adapted to allow a single memory line to intersect a single zia contact area and to provide area between other memory lines for other zia contact areas.

In still other embodiments, the present invention provides a memory layer for a three-dimensional memory. The memory layer includes a plurality of memory array blocks; a plurality of memory lines coupled to the memory array blocks; and a plurality of zia contact areas for coupling the memory layer to other memory layers in a three-dimensional memory. The memory lines extend from the memory array blocks and are formed using a sidewall defined process. The memory lines have a half pitch dimension smaller than the nominal minimum feature size capability of a lithography tool used in forming the memory lines. The zia contact areas have a dimension that is approximately four times the half pitch dimension of the memory lines. The memory lines are arranged in a pattern adapted to allow a single memory line to intersect a single zia contact area and to provide area between other memory lines for other zia contact areas.

In still other embodiments, memory lines may extend out from an edge of the memory array in first groups of adjacent lines (i.e., a first set of multiple groups of two or more lines) interleaved with second groups of adjacent lines (i.e., a second set of multiple groups of two or more lines) that terminate at the edge of the array. The groups of array lines extend out from the array to a contact area including multiple rows of zias. There may be a plurality of zias greater than or equal in number to the plurality of groups of array lines. In some embodiments, the plurality of the array line groups may preferably be an even number.

In still yet other embodiments, a three-dimensional memory array according to the present invention includes a memory array layer including an array and a plurality of memory lines wherein portions of the memory lines extend from the array substantially parallel to each other. A first subset of the memory lines extend from a first side of the array. A second subset of the memory lines extend from a second side of the array. Within the first subset of memory lines, a first plurality of memory lines terminate proximate an edge of the array. Within the first subset of memory lines, a second plurality of memory lines extend beyond the edge of the array into a contact region. The contact region includes a plurality of contacts adapted to couple the second plurality of memory lines to support circuitry. The contacts are disposed in two or more rows. The contact rows are disposed substantially non-parallel to the memory lines and adjacent memory lines couple to contacts in different rows.

Persons of ordinary skill in the art will understand that alternative memory structures in accordance with this invention may be fabricated using other similar techniques. For example, memory cells may be formed that include a carbon layer 12 below diode 14.

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based material may be located below the diodes 14. As stated, although the invention has been described primarily with reference to amorphous carbon, other carbon-based materials may be similarly used. Further, each carbon-based layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a mask for patterning a memory array, comprising:
    forming first line features from a first template layer disposed above a memory layer stack;
    forming first sidewall spacers adjacent the first line features;
    forming second line features that extend in a first direction in a mask layer by using the first sidewall spacers as a hardmask;
    depositing a second template layer on the mask layer;
    forming third line features from the second template layer that extend in a second direction perpendicular to the first direction;
    forming second sidewall spacers adjacent the third line features; and
    forming an array of pillar features in the mask layer by using the second sidewall spacers as a hardmask.

2. The method of claim 1, further comprising forming memory cell pillars using the mask layer including the array of pillar features, as a hardmask to etch the memory layer stack.

3. The method of claim 1, wherein the first line features are formed using a lithography apparatus having a minimum pitch capability and wherein the first line features are formed with a minimum pitch using the minimum pitch capability of the lithography apparatus.

4. The method of claim 3, wherein the first sidewall spacers have a pitch smaller than the minimum pitch.

5. The method of claim 3, wherein the first sidewall spacers have a pitch approximately half of the minimum pitch.

6. The method of claim 3, wherein the second sidewall spacers have a pitch smaller than the minimum pitch.

7. The method of claim 3, wherein the second sidewall spacers have a pitch approximately half of the minimum pitch.

8. The method of claim 1, further comprising:
removing the first sidewall spacers prior to depositing the second template layer.

9. A mask for patterning a memory array comprising:
a structure formed with first line features formed from a first template layer disposed above a memory layer stack, first sidewall spacers formed adjacent the first line features, second line features that extend in a first direction in a mask layer formed by using the first sidewall spacers as a hardmask, a second template layer deposited on the mask layer, third line features formed from the second template layer that extend in a second direction perpendicular to the first direction, second sidewall spacers formed adjacent the third features, and an array of pillar features in the mask layer formed by using the second sidewall spacers as a hardmask.

10. The mask of claim 9, wherein the first line features are formed using a lithography apparatus having a minimum pitch capability and wherein the first line features are formed with a minimum pitch using the minimum pitch capability of the lithography apparatus.

11. The mask of claim 10, wherein the first sidewall spacers have a pitch smaller than the minimum pitch.

12. The mask of claim 10, wherein the first sidewall spacers have a pitch approximately half of the minimum pitch.

13. The mask of claim 10, wherein the second sidewall spacers have a pitch smaller than the minimum pitch.

14. The mask of claim 10, wherein the second sidewall spacers have a pitch approximately half of the minimum pitch.

15. The mask of claim 9, wherein the first sidewall spacers are removed prior to the second template layer being deposited.

16. A memory cell array formed using the mask of claim 9.

* * * * *